(12) United States Patent
Abe et al.

(10) Patent No.: US 12,342,667 B2
(45) Date of Patent: Jun. 24, 2025

(54) LED MODULE

(71) Applicant: Japan Display Inc., Tokyo (JP)

(72) Inventors: Hideaki Abe, Tokyo (JP); Kazuyuki Yamada, Tokyo (JP); Keisuke Asada, Tokyo (JP); Kota Uogishi, Tokyo (JP); Kenichi Takemasa, Tokyo (JP); Daiki Isono, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 512 days.

(21) Appl. No.: 17/696,927

(22) Filed: Mar. 17, 2022

(65) Prior Publication Data

US 2022/0209081 A1 Jun. 30, 2022

Related U.S. Application Data

(63) Continuation of application No. PCT/JP2020/031243, filed on Aug. 19, 2020.

(30) Foreign Application Priority Data

Sep. 20, 2019 (JP) ................... 2019-171716

(51) Int. Cl.
*H01L 33/60* (2010.01)
*H10H 20/856* (2025.01)
*H10H 20/857* (2025.01)

(52) U.S. Cl.
CPC ........ *H10H 20/856* (2025.01); *H10H 20/857* (2025.01)

(58) Field of Classification Search
CPC ......... H01L 33/60; H01L 33/62; H01L 33/48; H01L 33/00–648; H01L 27/15–156; H01L 2933/00–0091; H05B 33/06; H05B 33/26–28; H05B 37/01; H05B 33/24; G09G 2300/0421–0434; G09G 2300/0456; G09F 9/33; G06F 1/18–189; H10H 20/856; H10H 20/857; H10H 20/85; H10H 20/00–841; H10H 29/00–142; H10H 29/30–962
See application file for complete search history.

(56) References Cited

U.S. PATENT DOCUMENTS

2021/0358393 A1* 11/2021 Kang ................... G09G 3/32

FOREIGN PATENT DOCUMENTS

JP 2004-119147 A 4/2004
JP 2008-234928 A 10/2008

OTHER PUBLICATIONS

International Search Report and Written Opinion mailed on Nov. 10, 2020, received for PCT Application PCT/JP2020/031243, Filed on Aug. 19, 2020, 8 pages including English Translation.

* cited by examiner

*Primary Examiner* — Cuong B Nguyen
(74) *Attorney, Agent, or Firm* — XSENSUS

(57) ABSTRACT

An LED module has a first layer including a first plane, an LED chip arranged on the first plane, a second layer surrounding the LED chip and including a convex part on the first plane, and a third layer arranged outside the LED chip and overlapping an upper surface of the first layer, a side surface of the second layer, and a part of the upper surface of the second layer. In the LED module, a height of the convex part of the second layer is lower than a height of the upper surface of the LED chip, and the first layer, the second layer and the third layer include conductive films.

8 Claims, 22 Drawing Sheets

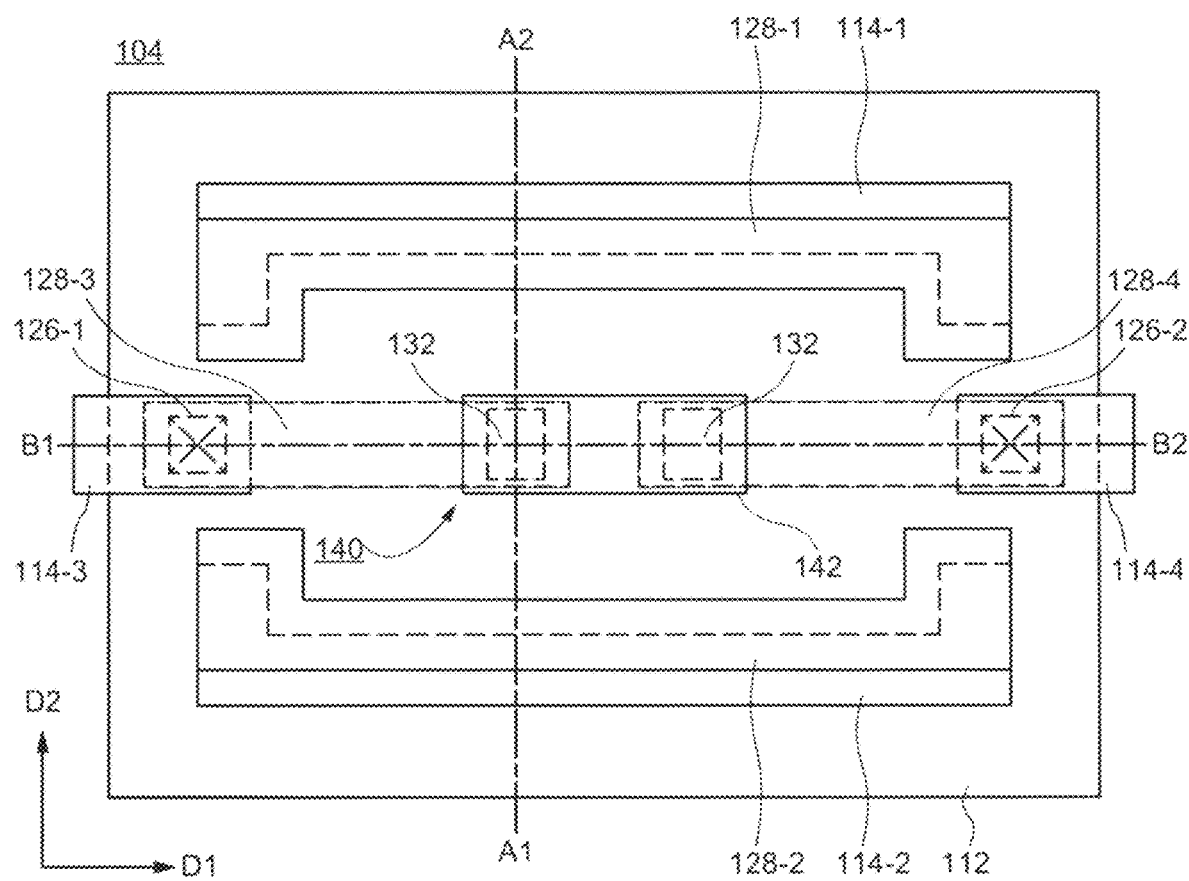

LED MODULE

CROSS-REFERENCE TO RELATED APPLICATIONS

This application is a U.S. continuation application filed under 35 U.S.C. § 111(a), of International Application No. PCT/JP2020/031243, filed on Aug. 19, 2020, which claims priority to Japanese Patent Application No. 2019-171716, filed on Sep. 20, 2019, the disclosures of which are incorporated herein by reference.

FIELD

An embodiment of the present invention relates to an LED module.

BACKGROUND

An LED module in which one or more microscopic light-emitting diodes (micro LEDs) are provided in each pixel arranged in a matrix on a substrate is being developed as an example of a display device. Since the LED is composed of an inorganic compound, it is easy to secure high luminous efficiency, high brightness, and high reliability as compared with an organic light-emitting diode (OLED) composed of an organic compound, for example. Therefore, the LED module is expected to be a new type of module with high brightness and high reliability.

The LED emits light not only from the upper surface (surface) but also from the side surfaces and bottom surface (back surface) of the LED. Therefore, in the LED module, if it is possible to utilize not only light from the upper surface of the LED but also light from the side surfaces or bottom surface, it is possible to improve the luminous efficiency of the LED module. For example, in the OLED, a method for improving light extraction efficiency by providing a reflector on a photosensitive resin processed into an uneven shape is known (for example, Japanese Laid Open Patent No. 2008-234928). In addition, for example, in the OLED, a method for improving the light extraction efficiency by providing a reflector on a convex-shaped substrate (for example, Japanese Laid Open Patent No. 2004-119147) is known.

SUMMARY

An LED module according to an embodiment of the present invention includes a first layer including a first plane, an LED chip arranged on the first plane, a second layer surrounding the LED chip and including a convex part on the first plane, and a third layer arranged outside the LED chip and overlapping an upper surface of the first layer, a side surface of the second layer, and a part of the upper surface of the second layer, wherein a height of the convex part of the second layer is lower than a height of the upper surface of the LED chip, and the first layer, the second layer, and the third layer include conductive films.

An LED module according to an embodiment of the present invention includes a first insulating film including a first plane, a first layer provided on the first insulating film having a first hole part exposing the first plane and forming a convex part defining the first hole part, at a position overlapping the first hole part, a second layer arranged on the first plane surface and a side surface and an upper surface of the convex part, an LED chip arranged on the second layer at a position overlapping the first hole part, and a third layer overlapping an upper surface of the first layer, a side surface of the second layer, and a part of the upper surface of the second layer on the outside of the LED chip, wherein the third layer, the second layer, and the third layer include conductive films.

BRIEF DESCRIPTION OF DRAWINGS

FIG. 2 is a plan view of an LED module according to an embodiment of the present invention;

DESCRIPTOIN OF EMBODIMENTS

Figure 1:
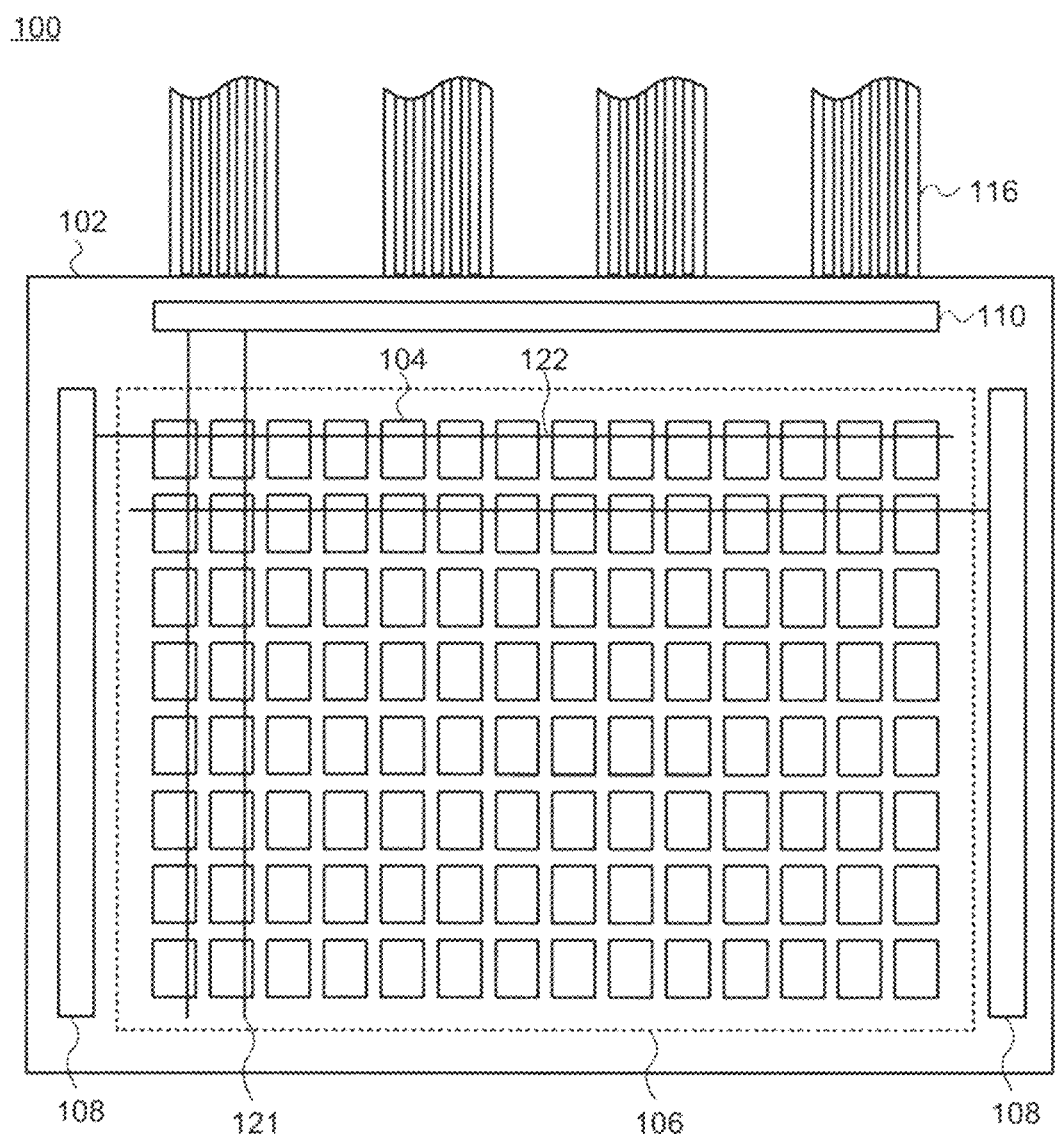
FIG. 1 is a schematic view showing a configuration of an LED module according to an embodiment of the present invention.

Hereinafter, each embodiment of the present invention will be described with reference to drawings and the like.

However, the present invention can be implemented in various modes without departing from the gist of the technical idea thereof, and should not be construed as being limited to the description of the embodiments exemplified below.

Although the drawings may be schematically represented in terms of width, thickness, shape, and the like of each part as compared with actual embodiments for the sake of clarity of description, these are merely examples, and the illustrated shape itself is not intended to limit the interpretation of the present invention. In the drawings, elements having the same functions as those described for the drawings already described in the specification are denoted by the same symbols even in other drawings, and duplicate explanations may be omitted.

In the case where a film is formed by a plurality of structures, each structure may have different functions and roles, and each structure may have a different base on which it is formed.

When expressing the mode where a structure is arranged on another structure, simply expressing "above" includes both the case of arranging another structure directly above a structure in contact with the structure and the case of arranging another structure above a structure via another structure, unless otherwise specified.

The expression "one structure is exposed from another structure" means an area in which a part of one structure is not covered by another structure. However, it also includes the case where the part not covered by another structure is covered by yet another structure.

In this specification and the drawings, the same symbols are used when describing a plurality of the same or similar configurations as a whole. The same symbol is used when describing multiple parts of one configuration separately, and hyphens and natural numbers are used.

In view of the above problems, it is an object of the present invention to provide an LED module having a structure with high light extraction efficiency from a display area.

In a number of embodiments shown below, an LED module having a structure with high light extraction efficiency from a display area is exemplified.

First Embodiment

In the present embodiment, a structure of an LED module 100, which is an embodiment of the present invention, will be described. In this specification, the LED module is, for example, a display device or a backlight of a display device.

<1. Overall Configuration>

FIG. 1 is a schematic view showing a configuration of the LED module 100 according to an embodiment of the present invention. The LED module 100 is, for example, a passive matrix type LED module. The LED module 100 includes a substrate 102.

The substrate 102 includes a material selected from, for example, glass, quartz, a polyester such as polyimide, polyamide, polyethylene terephthalate, polynaphthalene terephthalate, or the like, or a polymer such as a polycarbonate containing an aromatic ring in its main chain. The substrate 102 may have flexibility.

A conductor, structure, conductive film, and insulating film in which a conductive film and an insulating film are patterned are appropriately arranged on the substrate 102. Pixels 104, a driving circuit for driving the pixels 104, a plurality of bit lines 121 and a plurality of word lines 122, a plurality of terminals (not shown) connected to the pixel 104, and a driving circuit, and the like are configured by the patterned conductor, structure, conductive film, and insulating film.

A display area 106 refers to one area that includes the pixels 104 and has a minimal area enclosing all pixels 104. Each of the pixels 104 has a pixel circuit. The arrangement of the pixels 104 is not limited, and may be, for example, a stripe arrangement shown in FIG. 1 or a delta arrangement. In this case, the pixel 104 will be described as a minimum unit that gives color information. The pixel 104 is an area that includes an LED chip 140 (described later) and a pixel circuit for driving the LED chip 140.

The driving circuit includes, for example, a bit line driving circuit 108 and a word line driving circuit 110. The bit line driving circuit 108 and the word line driving circuit 110 drive the pixels 104. The plurality of bit lines 121 and the plurality of word lines 122 function as wirings for providing a current or a voltage from the driving circuit to each pixel 104. The plurality of terminals are connected to a connector 116. The connector 116 is, for example, a flexible printed circuit (FPC). Power source and video signals are supplied from an external circuit (not shown) to the LED module 100 via the connector 116. The pixel 104 is provided at an intersection of the bit line 121 and the word line 122, or the vicinity thereof, and a current or a voltage is supplied to the pixel circuit of each pixel 104 via the bit line 121 and the word line 122. As a result, the display area 106 displays an image.

Although not shown, the LED module 100 may be an active matrix type LED module. In the case where the LED module 100 is an active matrix type LED module, a pixel circuit including one or more transistors and capacity elements in each pixel is formed by a stack of the patterned various conductors, structures, conductive films, insulating films, and semiconductor films.

<2. Pixel>

Figure 3A:
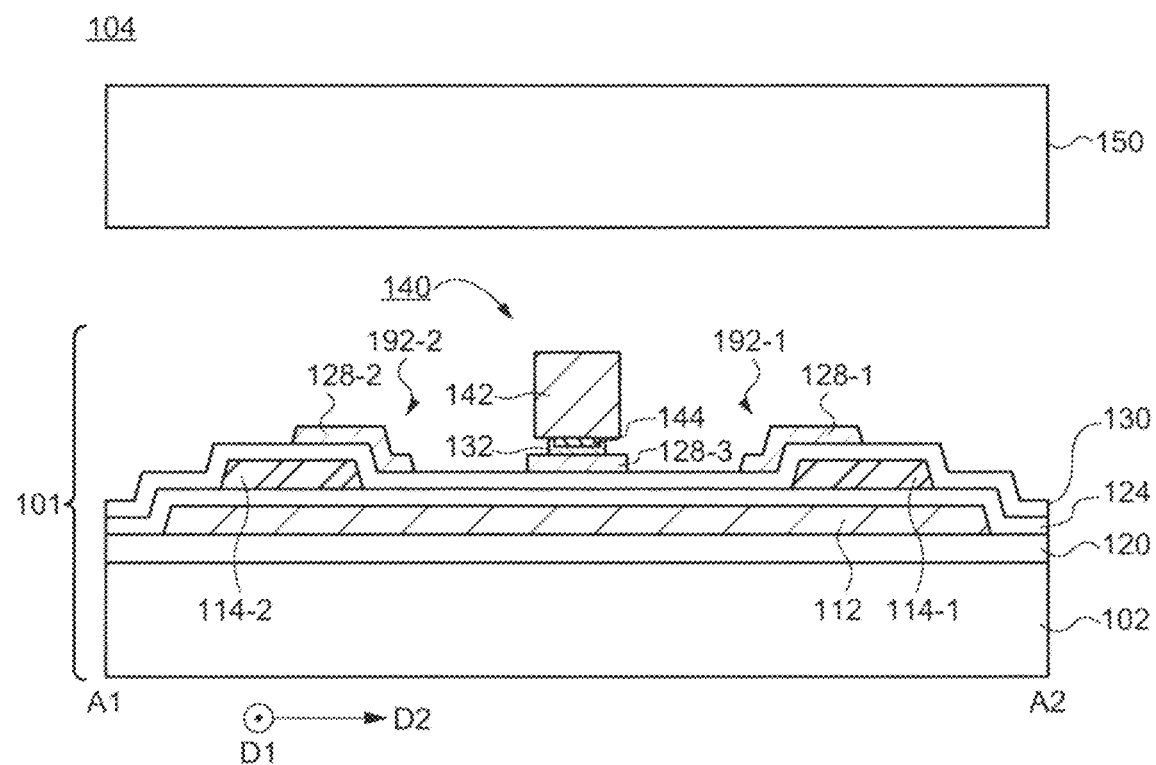
FIG. 3A is a cross-sectional view along a line A1-A2 an LED module according to an embodiment of the present invention.
Figure 3B:
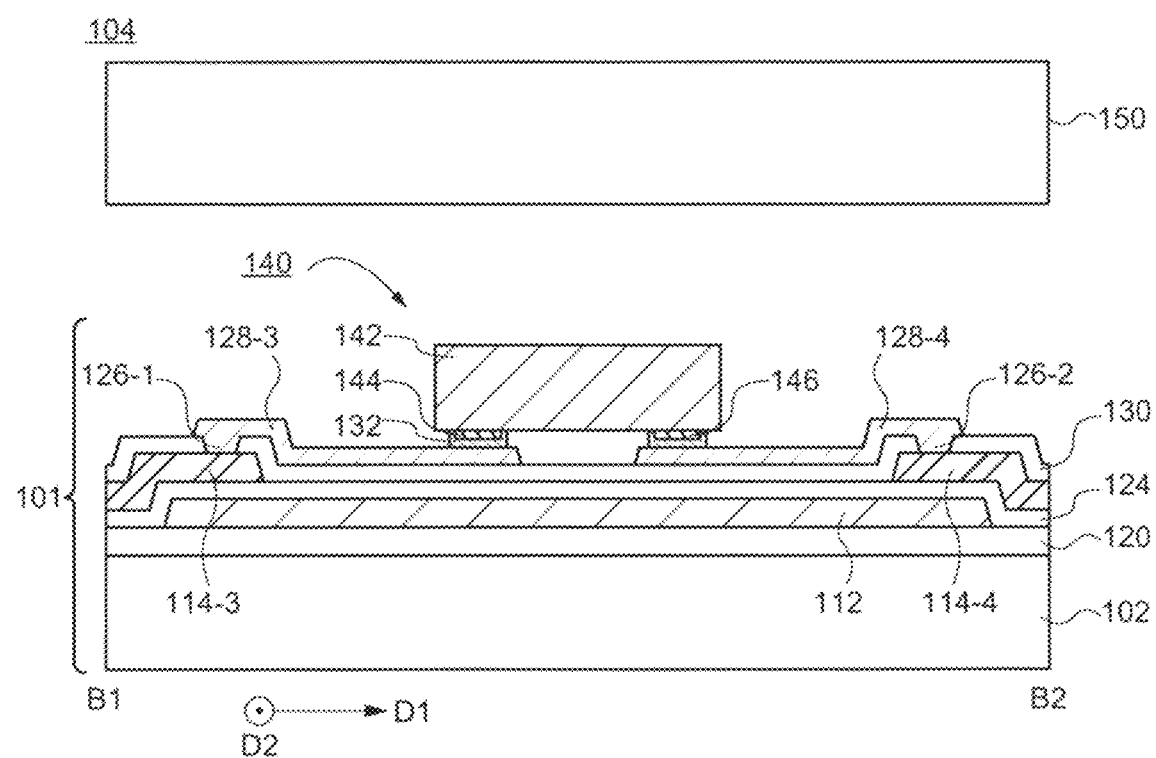
FIG. 3B is a cross-sectional view along a line B1-B2 of an LED module according to an embodiment of the present invention.

FIG. 2 is a plan view of the LED module according to an embodiment of the present invention. FIG. 3A is a cross-sectional view along a line A1-A2 of the LED module according to the embodiment of the present invention shown in FIG. 2. FIG. 3B is a cross-sectional view along a line B1-B2 of the LED module according to the embodiment of the present invention shown in FIG. 2.

As shown in FIG. 2, each pixel 104 includes the substrate 102, a first insulating film 120, a first conductive film 112, a second insulating film 124, a first convex part 114-1, a second convex part 114-2, a first electrode 114-3, a second electrode 114-4, a third insulating film 130, an opening 126-1, an opening 126-2, a first conductor 128-1, a second conductor 128-2, a third conductor 128-3, a fourth conductor 128-4, a conductive adhesive 132, and the LED chip 140. In an embodiment of the present invention, a counter substrate 150 facing the substrate 102 is provided. In this specification, the third conductor 128-3 is referred to as a first wiring, and the fourth conductor 128-4 is referred to as a second wiring.

Each pixel 104 is arranged in a matrix in a first direction D1 and a second direction D2 intersecting the first direction. For example, the first direction D1 may be parallel to the bit line 121, the second direction D2 may be parallel to the word line 122, the first direction D1 may be parallel to the word line 122, and the second direction D2 may be parallel to the bit line 121. Each pixel 104 has a pixel circuit. The pixel circuit has, for example, a configuration as shown in FIG. 2, FIG. 3A, and FIG. 3B.

The pixel circuit is provided such that the first insulating film 120 covers the substrate 102 in the pixel circuit included in the pixel 104, as shown in FIG. 3A and FIG. 3B, for example. The first insulating film 120 is, for example, a film containing a silicon-containing inorganic compound such as silicon oxide or silicon nitride, or a film containing one or more films containing organic compound such as an epoxy resin, an acrylic resin, or a silicon resin.

The first conductive film 112 is provided on the first insulating film 120. The first conductive film 112 can selectively reflect light from the LED chip 140. The reflected light can be extracted from the counter substrate 150 sides. Materials forming the first conductive film include, for example, aluminum, copper, silver, magnesium, titanium, molybdenum, tungsten, or an alloy containing these, and the like. In this specification and the like, the first conductive film 112 is also referred to as a first layer.

The second insulating film 124 is provided so as to cover the first conductive film 112. The second insulating film 124 is provided to electrically insulate the first conductive film 112 and a second conductive film to be described later. For example, a configuration similar to that of the first insulating film 120 can be used for the second insulating film 124.

The second conductive film is provided on the second insulating film 124. The second conductive film includes the first convex part 114-1, the second convex part 114-2, the first electrode 114-3, and the second electrode 114-4. The first convex part 114-1, the second convex part 114-2, the first electrode 114-3, and the second electrode 114-4 are provided in the same layer separately from each other. The first convex part 114-1 and the second convex part 114-2 have a convex shape and may have a function for reflecting light. The first electrode 114-3 and the second electrode 114-4 may have the function of supplying a current or a voltage to the LED chip 140 to cause the LED chip 140 to emit light. By providing the first convex part 114-1, the second convex part 114-2, the first electrode 114-3, and the second electrode 114-4 in the same layer, members having different functions can be provided in the same layer. Therefore, processes in the LED module according to an embodiment of the present invention can be simplified as compared with a structure in which the first convex part 114-1 and the second convex part 114-2 and the first electrode 114-3 and the second electrode 114-4 are provided separately.

In the second conductive film, for example, the first electrode 114-3 may be electrically connected to the word line 122 and the second electrode 114-4 may be electrically connected to the bit line 121. Further, as shown in FIG. 2, in a plan view, the first convex part 114-1 and the second convex part 114-2 are provided to face each other, having a polygonal shape. The first convex part 114-1 and the second convex part 114-2 are arranged so as to surround the LED chip 140. Further, as shown in FIG. 3A, the cross-sectional shapes of the first convex part 114-1 and the second convex part 114-2 have a tapered shape 192-1 and a tapered shape 192-2 in the second direction D2. The first convex part 114-1 and the second convex part 114-2 are arranged at a position lower than the upper surface of the LED chip 140. A material forming the second conductive film may be, for example, a material similar to the material for forming the first conductive film 112. Since the cross-sectional shapes of the first convex part 114-1 and the second convex part 114-2 are tapered shapes, and the first conductor 128-1 and the second conductor 128-2 formed on the first convex part 114-1 and the second convex part 114-2 have a shape having a step, the light from the LED chip 140 can be selectively reflected. Consequently, the light conventionally emitted to the transverse direction with respect to the LED chip 140, such as the first direction D1, the second direction D2, can be condensed to the counter substrate 150 sides. In this specification and the like, the second conductive film is also referred to as a second layer.

The first convex part 114-1 and the second convex part 114-2 may not be included in the second conductive film. For example, the first convex part 114-1 and the second convex part 114-2 may be provided by the material forming the first insulating film 120. In this case, the first convex part 114-1, the second convex part 114-2, and the first conductor 128-1, the second conductor 128-2 included in the second conductive film are formed in the same layer by different processes. For example, any insulating film is formed to form the first convex part 114-1 and the second convex part 114-2, and then the second conductive film may be formed to form the first conductor 128-1 and the second conductor 128-2, or the second conductive film is formed to form the first conductor 128-1 and the second conductor 128-2, and then any insulating film is formed to form the first convex part 114-1 and a second convex part 114-2. The cross-sectional shapes of the first convex part 114-1 and the convex part 114-2 are tapered shapes, and it is sufficient that the first conductor 128-1 and the second conductor 128-2 formed on the convex part 114-1 and the second convex part 114-2 have a shape having a step.

The third insulating film 130 is provided on the second conductive film. The third insulating film 130 is provided to electrically insulate the first convex part 114-1, the second convex part 114-2, the first electrode 114-3, and the second electrode 114-4 included in the second conductive film from a third conductive film to be described later. For example, a configuration similar to that of the first insulating film 120 can be used for the third insulating film 130.

The third conductive film is provided on the third insulating film 130. The third conductive film includes the first conductor 128-1, the second conductor 128-2, the third conductor 128-3, and the fourth conductor 128-4. The first conductor 128-1, the second conductor 128-2, the third conductor 128-3, and the fourth conductor 128-4 are provided in the same layer separately from each other. The first conductor 128-1 and the second conductor 128-2 overlap the convex part and may have a function for reflecting light. The third conductor 128-3 and the fourth conductor 128-4 may have the function of supplying a current or a voltage to the LED chip 140 to cause the LED chip 140 to emit light. By providing the first conductor 128-1, the second conductor 128-2, the third conductor 128-3, and the fourth conductor 128-4 in the same layer, members having different functions can be provided in the same layer. Therefore, the LED module according to an embodiment of the present invention can simplify the process compared to a structure in which the first conductor 128-1, and the second conductor 128-2, the third conductor 128-3, and the fourth conductor 128-4 are provided separately.

In the third conductive film, for example, the third conductor 128-3 is electrically connected to the first electrode 114-3 via the opening 126-1 formed in the third insulating film 130, and the fourth conductor 128-4 is electrically connected to the second electrode 114-4 via the opening 126-2 formed in the third insulating film 130. Further, as shown in FIG. 2, in a plan view, the first conductor 128-1 and the second conductor 128-2 have a polygonal shape and are provided to face each other, and the third conductor 128-3 and the fourth conductor 128-4 are provided between the first conductor 128-1 and the second conductor 128-2. As shown in FIG. 3A, the first conductor 128-1 is provided on the upper surface and the side surface of the first convex part 114-1, and the second conductor 128-2 is provided on the upper surface and the side surface of the second convex part 114-2 and on the first conductive film 112. That is, a part of the first conductor 128-1 overlaps the first convex part 114-1 and the first conductive film 112, and a part of the second conductor 128-2 overlaps the second convex part 114-2 and the first conductive film 112. The cross-sectional shape of the first conductor 128-1 and the second conductor 128-2 has the tapered shape 192-1 and the tapered shape 192-2 in the second direction D2.

Since the first conductor 128-1 and the second conductor 128-2 are provided on the convex part and the cross-sectional shapes of the first conductor 128-1 and the second conductor 128-2 are tapered shapes, the first conductor 128-1 and the second conductor 128-2 can selectively reflect light from the LED chip 140. Also, for example, since the first conductor 128-1 and the second conductor 128-2 are provided near the LED chip 140 without be interposed by an insulating layer, the light from the LED chip 140 can be reflected by the first conductor 128-1 and the second conductor 128-2 directly. As a result, in the LED module according to an embodiment of the present invention, the loss of reflection of light is reduced and the light extraction efficiency can be further improved by the first conductor 128-1 and the second conductor 128-2. Further, in the LED module according to an embodiment of the present invention, the light conventionally emitted to the transverse direction with respect to the LED chip 140, such as the first direction D1, the second direction D2, can be condensed to the counter substrate 150 sides so that the light extraction efficiency can be further improved. In this specification and the like, the third conductive film is also referred to as a third layer.

A material forming the third conductive film may be, for example, a material similar to the material for forming the first conductive film 112. The material forming the third conductive film may include a conductive material having light transmittance, such as indium-tin oxide (ITO), indium-zinc oxide (IZO), or the like. In the case where the third conductive film is a conductive material having light transmittance, the thicknesses of the first conductor 128-1 and the second conductor 128-2 are preferably equal to or less than the thicknesses of the first convex part 114-1 and the second convex part 114-2.

There is no restriction on the configuration of the pixel circuit provided in each pixel 104. The pixel circuit provided in each pixel 104 may be any configuration capable of emitting light from the LED chip 140.

The LED chip 140 is, for example, a current-driven type light-emitting element. The LED chip 140 includes a stack 142 and a pair of electrodes (an electrode 144 and an electrode 146). The stack 142 is a stack of compound semiconductors containing group 13 elements or group 14 elements such as indium, gallium, aluminium, nitrogen, phosphorus, and the like. The stack 142 is electrically connected to the pair of electrodes (the electrode 144 and the electrode 146). Specifically, the stack 142 includes an active layer, a p-layer containing a p-type compound semiconductor, an n-layer containing an n-type compound semiconductor, and a p-n junction layer formed by contacting the p-layer and the n-layer. Of the pair of electrodes, the electrode 144 is connected to the p-layer, and the electrode 146 is connected to the n-layer. A direct current is supplied to the stack 142 from a pair of electrodes (the electrode 144 and the electrode 146), and carriers are transported to the active layer via the p-layer and the n-layer. Recombination of the carriers occurs in the active layer, and an energy obtained by the recombination is extracted as light.

There is no limitation on the emission color of the LED chip 140. As a typical example, one or more of the plurality of LED chips 140 that emit red, green, or blue light are arranged in each pixel 104 so that the red, green, and blue LED chips 140 constituting the three primary colors are arranged in the LED module 100. In the case where the plurality of LED chips 140 are provided in one pixel 104, the LED chips 140 are arranged so that the LED chips 140 give the same emission color in each pixel 104.

In this specification and the like, the LED chip 140 is, for example, an LED such as a micro LED or a mini LED. The micro LED refers to a chip having a chip size of several μm or more and 100 μm or less, and the mini LED refers to a chip having a chip size of 100 μm or more, and in the LED module according to an embodiment of the present invention, any size of LEDs can be used, and they can be selectively used according to the LED module and the pixel size of the LED module.

The electrode 144 and the electrode 146, which are a pair of the LED chips 140, are electrically connected to the third conductor 128-3 and the fourth conductor 128-4, respectively, by the conductive adhesive 132. A material forming the conductive adhesive 132 may include, for example, a paste containing metal particles such as silver, copper, and nickel, or solder. The LED chip 140 is fixed to each pixel 104 by an adhesive 134. A current or a voltage supplied from the bit line 121 or the word line 122 is supplied to the electrode 144 and the electrode 146, which are a pair of electrodes, via the third conductor 128-3, the fourth conductor 128-4, and the conductive adhesive 132. The third conductor 128-3 and the fourth conductor 128-4 may be of any configuration, and the bit line 121 and the word line 122 may be directly connected to the electrodes 144 and 146, respectively, via the conductive adhesive 132.

The counter substrate 150 contains a material that is highly transmissive to visible light. The counter substrate 150 is configured to transmit, for example, light from the LED chip 140, light reflected by the first conductive film 112, and light reflected by the first conductor 128-1 and the second conductor 128-2. A material similar to the substrate 102 can be used for the counter substrate 150.

The counter substrate 150 may be made of different materials and have different thicknesses from the substrate 102. For example, it may be a combination in which that the substrate 102 is a resin film having flexibility and a counter substrate 105 is a thinner glass film (or thicker) than the resin substrate 102. With the above-described configuration, the light from the LED chip 140 can be selectively extracted from the counter substrate 150 sides.

In the following description, the substrate 102, the LED chip 140, and various conductors, structures, conductive films, insulating films, stacks of semiconductor films, wirings, and the like formed therebetween are generally referred to as a back plane 101. The display function, which is a basic function of the LED module 100, is expressed by the back plane 101.

In the LED module 100 according to an embodiment of the present invention, the first conductive film 112 is provided below the LED chip 140, a part of the first conductor 128-1 overlaps the first convex part 114-1 and the first conductive film 112, and a part of the second conductor 128-2 overlaps the second convex part 114-2 and the first conductive film 112. In the LED module 100 according to an embodiment of the present invention, the cross-sectional shape of the first conductor 128-1 and the second conductor 128-2 is a tapered shape. Consequently, in the LED module 100 according to an embodiment of the present invention, the light of the LED chip 140 can be condensed toward the LED chip 140, and the light can be extracted from the counter substrate 150 sides. Therefore, the light conventionally emitted to the transverse direction, or more accurately, diagonally downward with respect to the LED chip 140 can be condensed to the counter substrate 150 sides in the LED module 100 according to an embodiment of the present invention. As a result, the LED module 100 according to an embodiment of the present invention has a structure with high light extraction efficiency from the display area.

Second Embodiment

In the present embodiment, a structure of the LED module 100, which is one embodiment of the present invention, will be described. A configuration of the LED module 100 according to the present embodiment is different from the configuration of the LED module 100 according to the first embodiment in the configurations of the first convex part 114-1, the second convex part 114-2, the first conductor 128-1, and the second conductor 128-2. Description of the same configuration as that of the LED module 100 according to the first embodiment is omitted here. Description of the same or similar components as those of FIG. 1 to FIG. 3B may be omitted.

Figure 4:
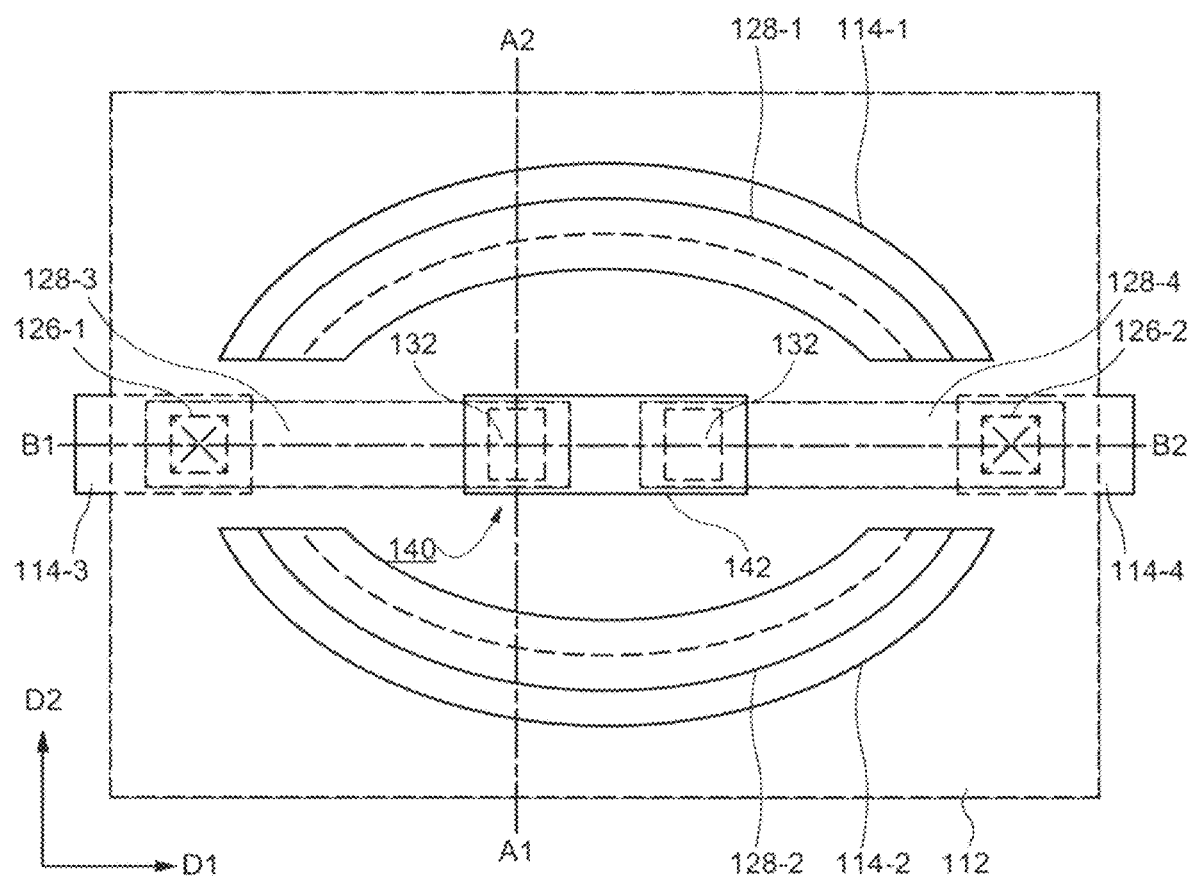
FIG. 4 is a plan view of an LED module according to an embodiment of the present invention.

FIG. 4 is a plan view of the LED module 100 according to an embodiment of the present invention. As shown in FIG. 4, the second conductive film includes the first convex part 114-1 and the second convex part 114-2, and in a plan view, the first convex part 114-1 and the second convex part 114-2 are provided to face each other and have an arc shape. Since the cross-sectional shape of the first convex part 114-1 and the second convex part 114-2 is similar to the shape shown in FIG. 3A and FIG. 3B, a description thereof will be omitted.

The third conductive film includes the first conductor 128-1 and the second conductor 128-2, and in a plan view, the first conductor 128-1 and the second conductor 128-2 have an arc shape and are provided to face each other, and the third conductor 128-3 and the fourth conductor 128-4 are provided between the first conductor 128-1 and the second conductor 128-2.

In the LED module 100 according to an embodiment of the present invention, the first conductive film 112 is provided below the LED chip 140, a part of the first conductor 128-1 having an arc shape overlaps the first convex part 114-1 having an arc shape and the first conductive film 112. A part of the second conductor 128-2 having arc shape overlaps the second convex part 114-2 having an arc shape and the first conductive film 112. In the LED module 100 according to an embodiment of the present invention, the cross-sectional shapes of the first conductor 128-1 and the second conductor 128-2 are a tapered shape. Since the LED module 100 according to an embodiment of the present invention has the structure with an arc shapes, it is easier to condense the light of the LED chip 140 toward the LED chip 140 as compared with the case where the shape of the structure is polygonal. Therefore, in the LED module 100, light can be more efficiently extracted from the counter substrate 150 sides.

Third Embodiment

The present embodiment will be describe the structure of the LED module 100, one of the embodiment of the present invention. A configuration of the LED module 100 according to the present embodiment is different from the configuration of the LED module 100 according to the second embodiment in the configurations of the first convex part 114-1, the second convex part 114-2, the first conductor 128-1, and the second conductor 128-2. Description of the same configuration as that of the LED module 100 according to the second embodiment is omitted here. Description of the same or similar components as those of FIG. 1 to FIG. 4 may be omitted.

Figure 5:
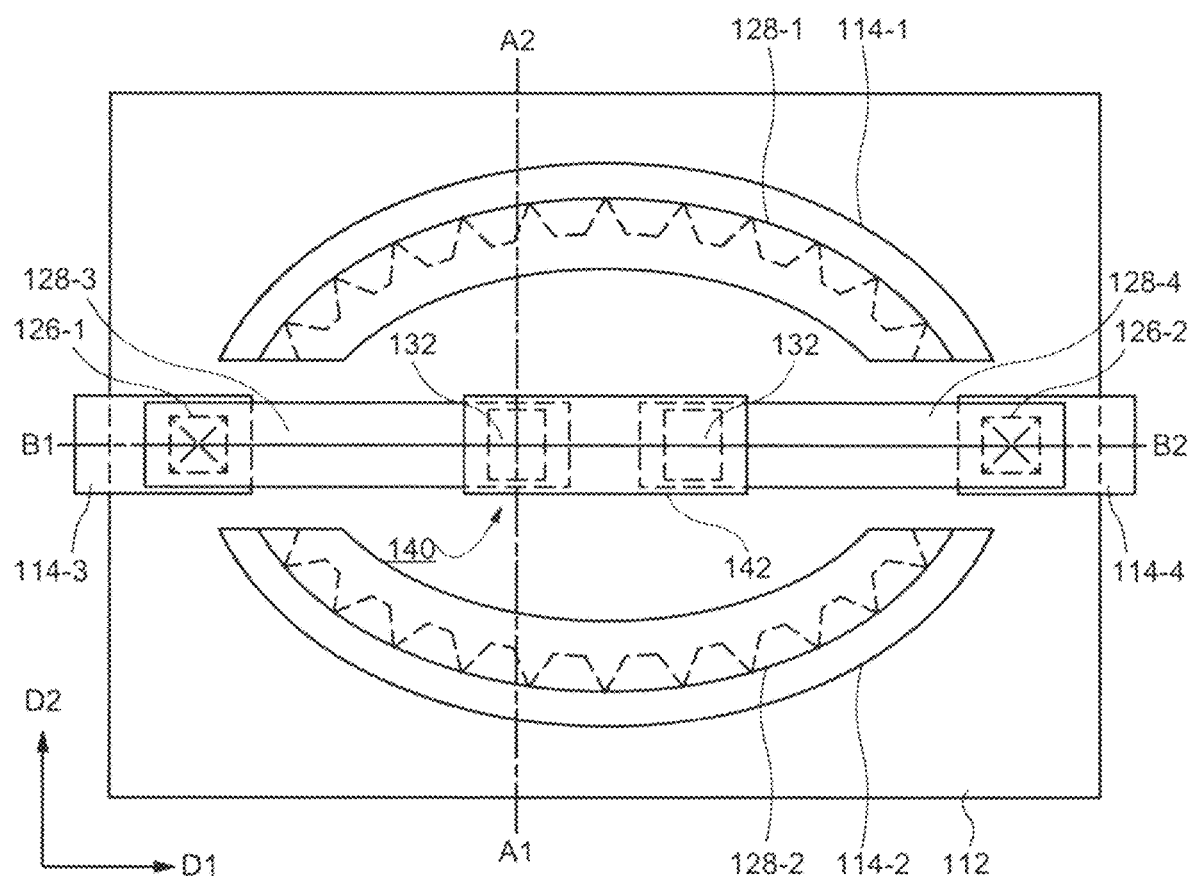
FIG. 5 is a plan view of an LED module according to an embodiment of the present invention.

FIG. 5 is a plan view of the LED module 100 according to an embodiment of the present invention. As shown in FIG. 5, the second conductive film includes the first convex part 114-1 and the second convex part 114-2, and in a plan view, the first convex part 114-1 and the second convex part 114-2 are provided to face each other and have an arc shape. The arc includes a plurality of triangular notches or a plurality of arc-shaped notches along the arc. Since the cross-sectional shapes of the first convex part 114-1 and the second convex part 114-2 are similar to the shape shown in FIG. 3A and FIG. 3B, a description thereof will be omitted.

The third conductive film includes the first conductor 128-1 and the second conductor 128-2, and in a plan view, the first conductor 128-1 and the second conductor 128-2 have an arc shape and are provided to face each other, and the third conductor 128-3 and the fourth conductor 128-4 are provided between the first conductor 128-1 and the second conductor 128-2.

In the LED module 100 according to an embodiment of the present invention, the first conductive film 112 is provided below the LED chip 140. A part of the first conductor 128-1 having an arc shape overlaps the first convex part 114-1 and the first conductive film 112. In this case, the first convex part 114-1 includes arc shaped notches having the plurality of triangular shapes along the arc, or arcuate notches. In the LED module 100, a part of the second conductor 128-2 having an arc shape overlaps the second convex part 114-2 including the first conductive film 112. In this case, the second convex part 114-2 includes arc shaped notches having the plurality of triangular shapes along the arc, or arcuate notches. In the LED module 100 according to an embodiment of the present invention, the cross-sectional shapes of the first conductor 128-1 and the second conductor 128-2 are a tapered shape. Since the LED module 100 according to an embodiment of the present invention has the structure including the arc shaped notches having the arc, or the plurality of arcuate notches, an area for reflecting light can be larger than the case where the shape of the structure is polygonal. Therefore, since the structure having a wider area may reflect the light of the LED chip 140, light can be more efficiently extracted from the counter substrate 150 sides.

Fourth Embodiment

Figure 6:
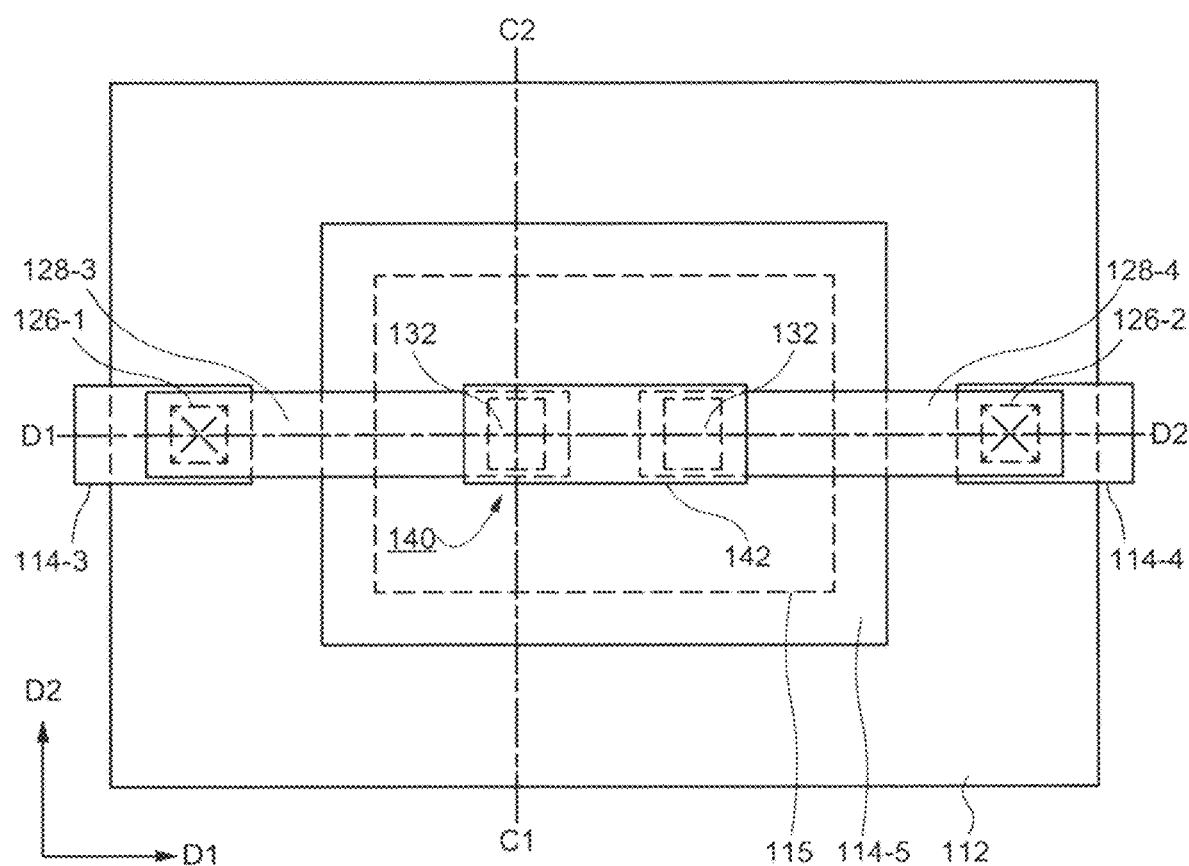
FIG. 6 is a plan view of an LED module according to an embodiment of the present invention.
Figure 7A:
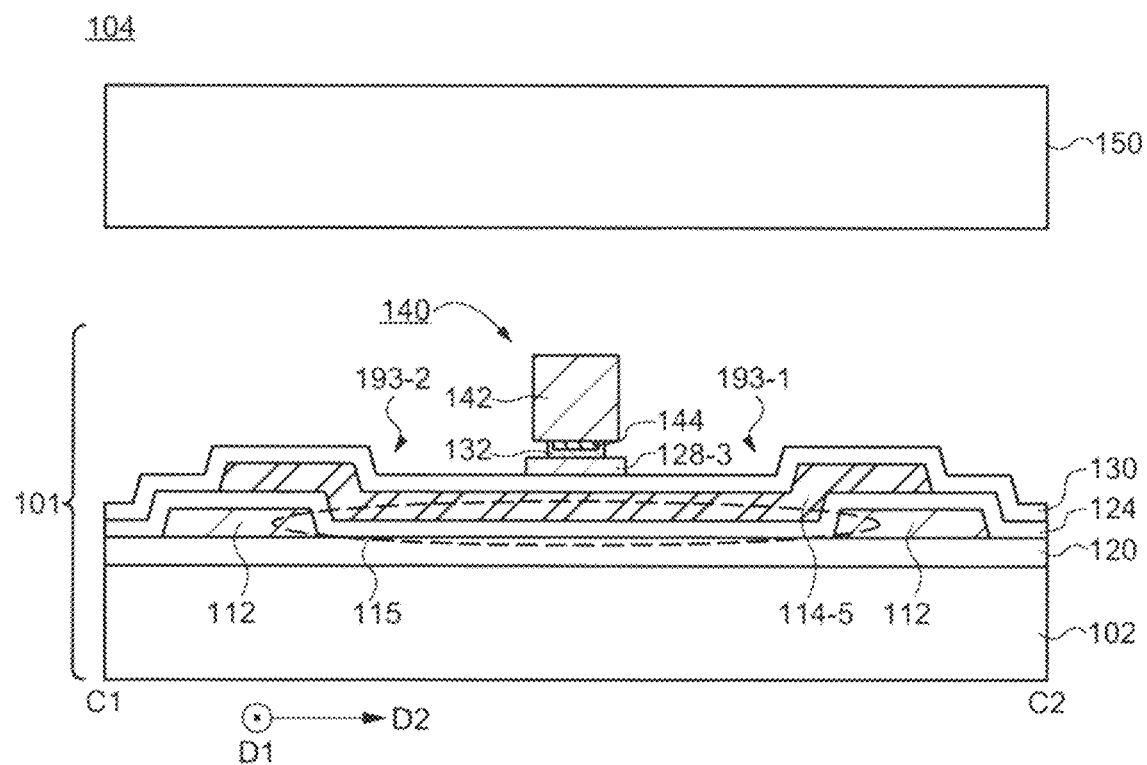
FIG. 7A is a cross-sectional view along a line C1-C2 of an LED module according to an embodiment of the present invention.
Figure 7B:
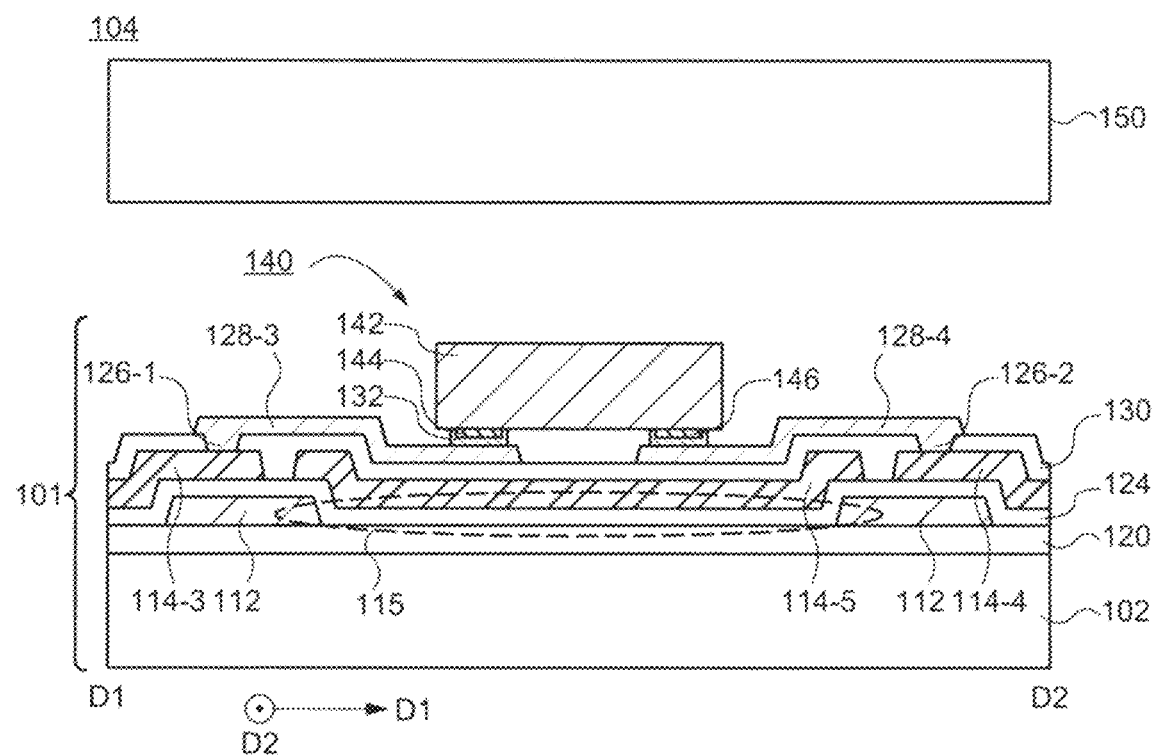
FIG. 7B is a cross-sectional view along a line D1-D2 of an LED module according to an embodiment of the present invention.

FIG. 6 is a plan view of an LED module according to an embodiment of the present invention. FIG. 7A is a cross-sectional view along a line C1-C2 of the LED module according to the embodiment of the present invention shown in FIG. 6. FIG. 7B is a cross-sectional view along a line D1-D2 of the LED module according to an embodiment of the present invention shown in FIG. 6. A configuration of the LED module 100 according to the present embodiment is different from the configuration of the LED module 100 according to the first embodiment in that the first conductive film 112 has a first hole part 115 and in the configuration of the second conductive film. Description of the same configuration as that of the LED module 100 according to the first embodiment is omitted here. Description of the same or similar components as those of FIG. 1 to FIG. 5 may be omitted.

As shown in FIG. 6, the first conductive film 112 is provided on the first insulating film 120. The first conductive film 112 has the first hole part 115. The first hole part 115 exposes the upper surface (plane surface) of the first insulating film 120. That is, the first conductive film 112 has a ring-like hollow structure. The first hole part 115 has a polygonal shape. The LED chip 140 is provided inside the first hole part 115. As shown in FIG. 7A and FIG. 7B, the cross-sectional shapes of the first conductive film 112 and the first hole part 115 have a tapered shape 193-1 and a tapered shape 193-2 in the second direction D2. The first conductive film 112 is formed in a ring-like shape and has a convex part in a cross-sectional view. The convex part forms the shape of the first hole part 115. In other words, the convex part defines the first hole part 115. As will be described in detail later, since the first conductive film 112 has the convex part, and the cross-sectional shapes of the first conductive film 112 and the first hole part 115 have a tapered shape, the second conductive film formed on the first conductive film 112 and the first hole part 115 has a stepped shape, so that the second conductive film can selectively reflect light from the LED chip 140. Consequently, the light conventionally emitted to the transverse direction with respect to the LED chip 140, such as the first direction D1, the second direction D2, can be condensed to the counter substrate 150 sides.

The first conductive film 112 may be an insulating film. It is sufficient that the first conductive film 112 has the first hole part 115, the cross-sectional shape of the first conductive film 112 is a tapered shape, and the second conductive film formed on the first conductive film 112 and the first hole part 115 has a shape having a step.

The second insulating film 124 is provided so as to cover the first conductive film 112, contact the first insulating film 120, and fill the first hole part 115. The second insulating film 124 is provided to electrically insulate the first conductive film 112 and the second conductive film to be described later.

The second conductive film is provided on the second insulating film 124. The second conductive film is provided on the upper surface side and the side surface of the first conductive film 112 and on the first hole part 115. In other words, the second conductive film is arranged on the side surface and the upper surface of the convex part defining the first hole part at a position overlapping with the first hole part 115. The LED chip 140 is arranged on the second conductive film at a position overlapping with the first hole part 115. The second conductive film includes the first electrode 114-3, the second electrode 114-4, and a third structure 114-5. For example, as shown in FIG. 6, the third structure 114-5 has a polygonal shape in a plan view. As shown in FIG. 7A and FIG. 7B, the cross-sectional shape of the third structure 114-5 has the tapered shape 193-1 and the tapered shape 193-2 in the second direction D2. Since the cross-sectional shape of the third structure 114-5 is a tapered shape, the light from the LED chip 140 can be selectively reflected. Consequently, the light conventionally emitted to the transverse direction with respect to the LED chip 140, such as the first direction D1, the second direction D2, can be condensed to the counter substrate 150 sides.

The third insulating film 130 is provided on the second conductive film and the second insulating film 124. The third insulating film 130 is provided to electrically insulate the first electrode 114-3, the second electrode 114-4, and the third structure 114-5 included in the second conductive film from the third conductive film to be described later.

The third conductive film is provided on the third insulating film 130. The third conductive film includes the third conductor 128-3 and the fourth conductor 128-4. For example, the third conductor 128-3 is electrically connected to the first electrode 114-3 via the opening 126-1 formed in the third insulating film 130, and the fourth conductor 128-4 is electrically connected to the second electrode 114-4 via the opening 126-2 formed in the third insulating film 130. The third conductive film overlaps the upper surface of the first conductive film 112, the side surface of the second conductive film, and a part of the upper surface of the second conductive film on the outside of the LED chip 140.

Similar to the LED module 100 according to the first embodiment, the electrode 144 and the electrode 146, which are a pair of electrodes of the LED chip 140, are electrically connected to the third conductor 128-3 and the fourth conductor 128-4, respectively, by the conductive adhesive 132.

In the LED module 100 according to an embodiment of the present invention, the first conductive film 112 has the first hole part 115, and the third structure 114-5 included in the second conductive film overlaps the upper surface and the side surface of the first conductive film 112, and the first hole part 115. In the LED module 100 according to an embodiment of the present invention, the cross-sectional shapes of the first conductive film 112 and the third structure 114-5 have a tapered shape. Consequently, in the LED module 100 according to an embodiment of the present invention, by making the third structure 114-5 included in the second conductive film a stepped shape, the light of the LED chip 140 can be condensed toward the LED chip 140, and the light can be extracted from the counter substrate 150. Therefore, since the light conventionally emitted to the transverse direction with respect to the LED chip 140 can be condensed to the counter substrate 150 sides, The LED module 100 according to an embodiment of the present invention has a structure with high light extraction efficiency from the display area.

Fifth Embodiment

Figure 8:
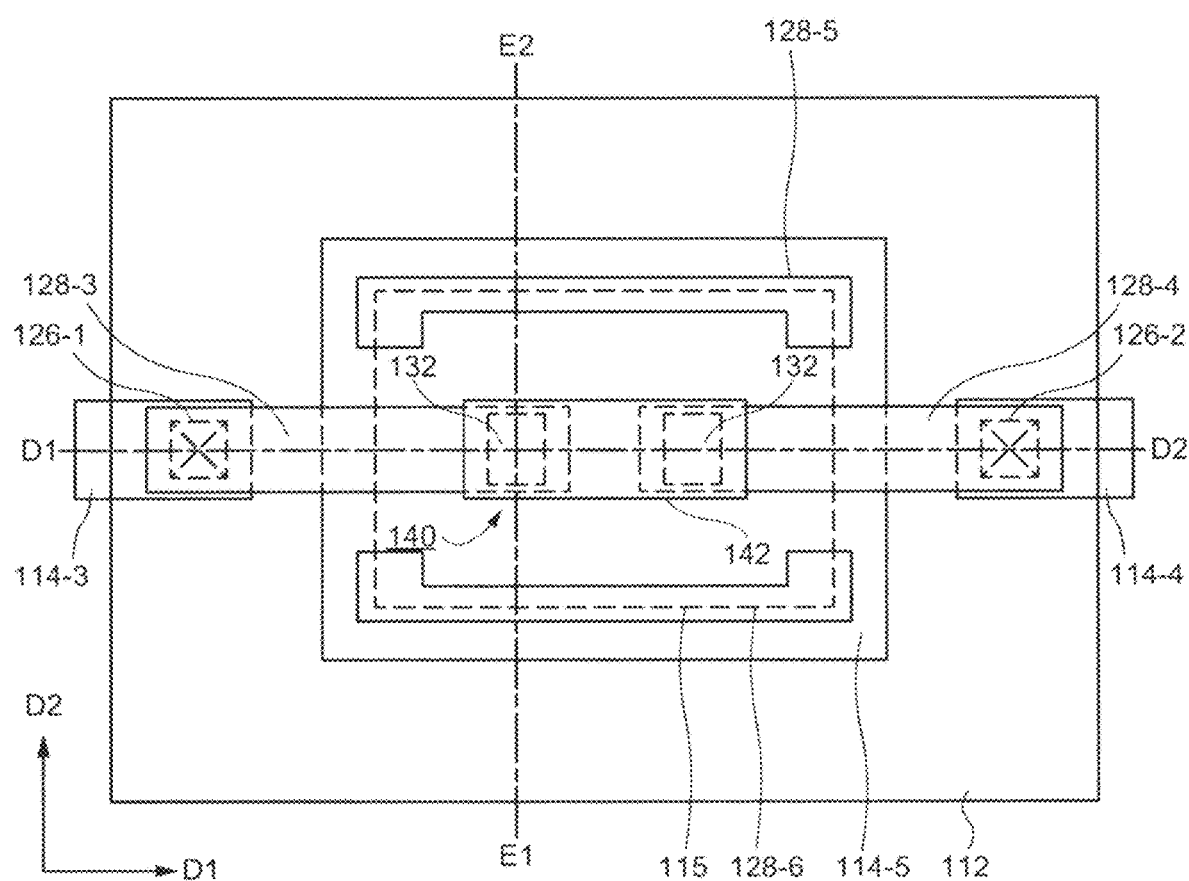
FIG. 8 is a plan view of an LED module according to an embodiment of the present invention.
Figure 9:
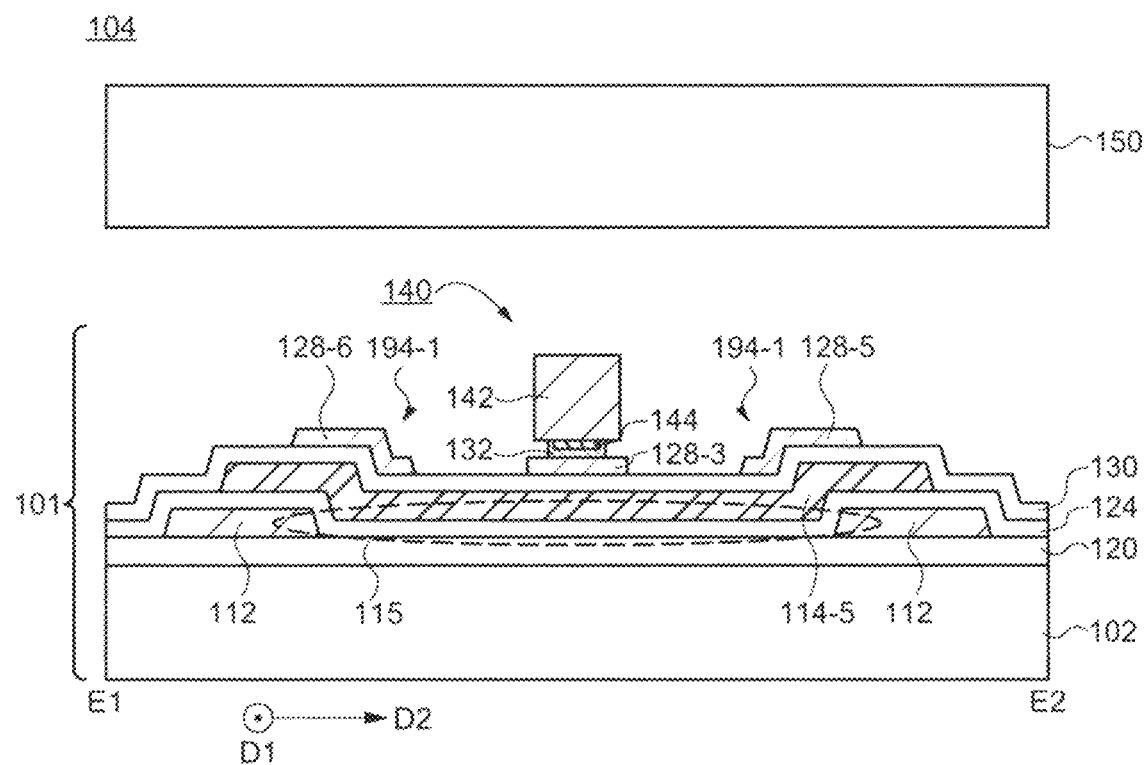
FIG. 9 is a cross-sectional view along a line E1-E2 of an LED module according to an embodiment of the present invention.

FIG. 8 is a plan view of LED module according to an embodiment of the present invention. FIG. 9 is a cross-sectional view along a line E1-E2 of the LED module according to an embodiment of the present invention shown in FIG. 8. A configuration of the LED module 100 according to the present embodiment is different from the configuration of the LED module 100 according to the fourth embodiment in that the third conductive film has a fifth conductor 128-5 and a sixth conductor 128-6. Description of the same configuration as that of the LED module 100 according to the fourth embodiment is omitted here. Description of the same or similar components as those of FIG. 1 to FIG. 7B may be omitted.

As shown in FIG. 8, a third conductive film is provided on the third insulating film 130. Since the cross-sectional shape along the line D1-D2 of the LED module 100 according to an embodiment of the present invention is similar to the shape shown in FIG. 7B, the description is omitted here. The third conductive film includes the third conductor 128-3, the fourth conductor 128-4, the fifth conductor 128-5, and the sixth conductor 128-6. The third conductor 128-3, the fourth conductor 128-4, the fifth conductor 128-5, and the sixth conductor 128-6 are provided in the same layer. For example, as shown in FIG. 8, in a plan view, the fifth conductor 128-5 and the sixth conductor 128-6 have a polygonal shape and are provided to face each other on the second conductive film. As shown in FIG. 8, the third conductor 128-3 and the fourth conductor 128-4 are provided between the fifth conductor 128-5 and the sixth conductor 128-6 on the second conductive film. As shown in FIG. 8, the third conductor 128-3, the fourth conductor 128-4, the fifth conductor 128-5, and the sixth conductor 128-6 are insulated from each other on the second conductive film. As shown in FIG. 8 and FIG. 9, the fifth conductor 128-5 and the sixth conductor 128-6 are provided so as to overlap an area where the cross-sectional shape of the first conductive film 112 and the third structure 114-5 included in the second conductive film is a tapered shape. The fifth conductor 128-5 and the sixth conductor 128-6 are provided on the upper surface and the side surface of the third structure 114-5, on the first conductive film 112, and on the first hole part 115. The cross-sectional shape of the fifth conductor 128-5 and the sixth conductor 128-6 has a tapered shape 194-1 and a tapered shape 194-2 in the second direction D2. The third conductive film overlaps the upper surface of the first conductive film 112, the side surface of the second conductive film, and a part of the upper surface of the second conductive film on the outside of the LED chip 140.

Similar to the LED module 100 according to the fourth embodiment, the electrode 144 and the electrode 146, which are a pair of electrodes of the LED chip 140, are electrically connected to the third conductor 128-3 and the fourth conductor 128-4, respectively, by the conductive adhesive 132.

Since the cross-sectional shape of the fifth conductor 128-5 and the sixth conductor 128-6 is a tapered shape, the LED module 100 according to an embodiment of the present invention can selectively reflect the light from the LED chip 140. Consequently, the light conventionally emitted to transverse direction with respect to the LED chip 140, such as the first direction D1, the second direction D2, can be condensed to the counter substrate 150 sides.

Sixth Embodiment

Figure 10:
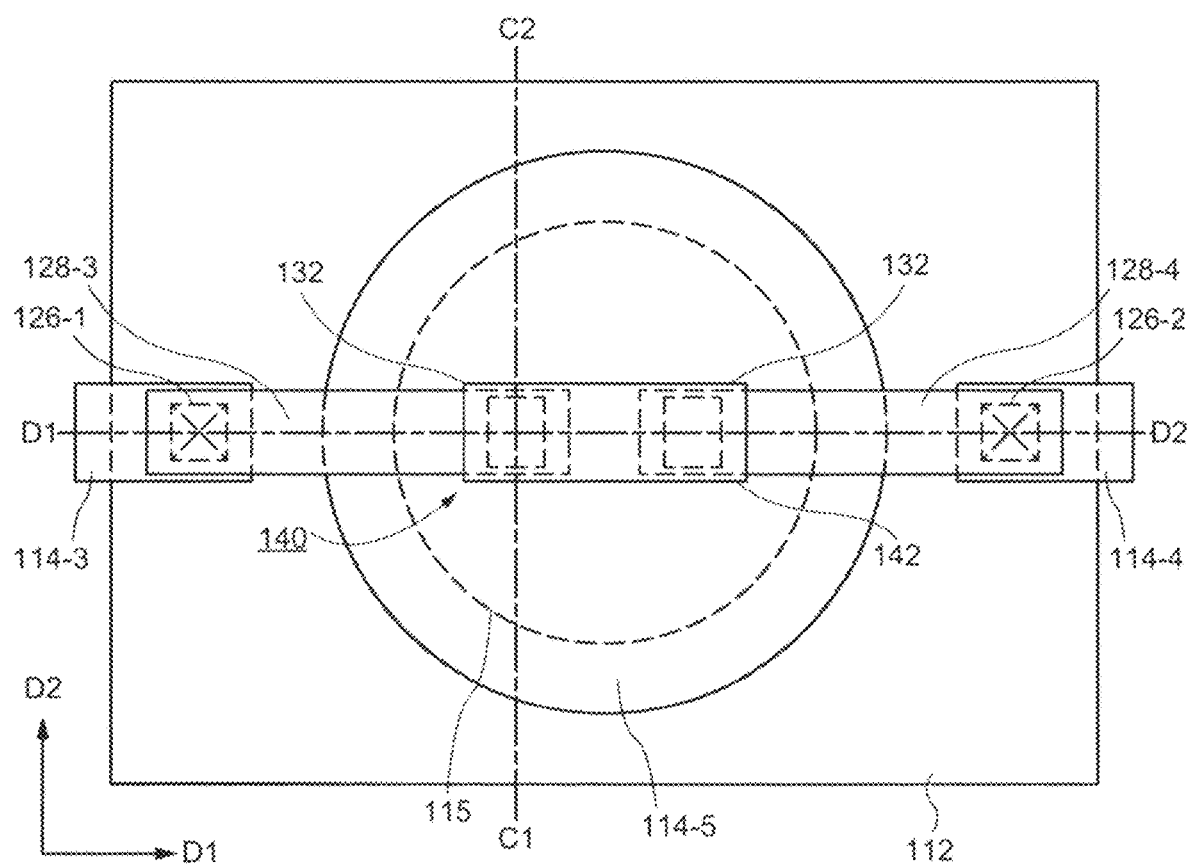
FIG. 10 is a plan view of an LED module according to an embodiment of the present invention.

FIG. 10 is a plan view of the LED module according to an embodiment of the present invention. A configuration of the LED module 100 according to the present embodiment is different from the configuration of the LED module 100 according to the fourth embodiment in that the first hole part 115 is circular and the shape of the third structure 114-5 included in the second conductive film is circular. Description of the same configuration as that of the LED module 100 according to the fourth embodiment is omitted here. Description of the same or similar components as those of FIG. 1 to FIG. 9 may be omitted.

Since the cross-sectional shape along the line C1-C2 of the LED module 100 according to an embodiment of the present invention is similar to the shape shown in FIG. 7A and the cross-sectional shape along the line D1-D2 is similar to the shape shown in FIG. 7B, the description thereof will be omitted.

Similar to the configuration shown in FIG. 8, the configuration of the LED module 100 according to the present embodiment may have the fifth conductor 128-5 and the sixth conductor 128-6. In the case where the LED module 100 according to the present embodiment has the fifth conductor 128-5 and the sixth conductor 128-6, the shape of the fifth conductor 128-5 and the shape of the sixth conductor 128-6 are an arc shape.

The LED module 100 according to an embodiment of the present invention has a circular first hole part 115, and the third structure 114-5 included in the second conductive film overlaps the upper surface and the side surface of the first conductive film 112, and the first hole part 115. In the LED module 100 according to an embodiment of the present invention, the cross-sectional shapes of the first conductive film 112 and the third structure 114-5 are a tapered shape. In the LED module 100 according to an embodiment of the present invention, by making the shape of the first hole part 115 a circular shape, and the third structure 114-5 included in the second conductive film a stepped shape, the light of the LED chip 140 can be more easily condensed toward the LED chip 140 as compared with the case where the shape of the first 115 is polygonal, and the light can be more efficiently extracted from the counter substrate 150 sides. Therefore, since the light conventionally emitted to the transverse direction with respect to the LED chip 140 can be condensed to the counter substrate 150 sides, a structure with high light extraction efficiency from the display area can be provided to the LED module 100 according to an embodiment of the present invention.

In the LED module 100 according to an embodiment of the present invention, the fifth conductor 128-5 and the sixth conductor 128-6 are provided in the area where the cross-sectional shape of the third structure 114-5 has a tapered shape. As a result, the light of the LED chip 140 is more easily condensed toward the LED chip 140 as compared with the case where the shape of the third structure 114-5 is polygonal also by providing the fifth conductor 128-5 and the sixth conductor 128-6. Therefore, the light can be more efficiently extracted from the counter substrate 150 sides.

Seventh Embodiment

Figure 11:
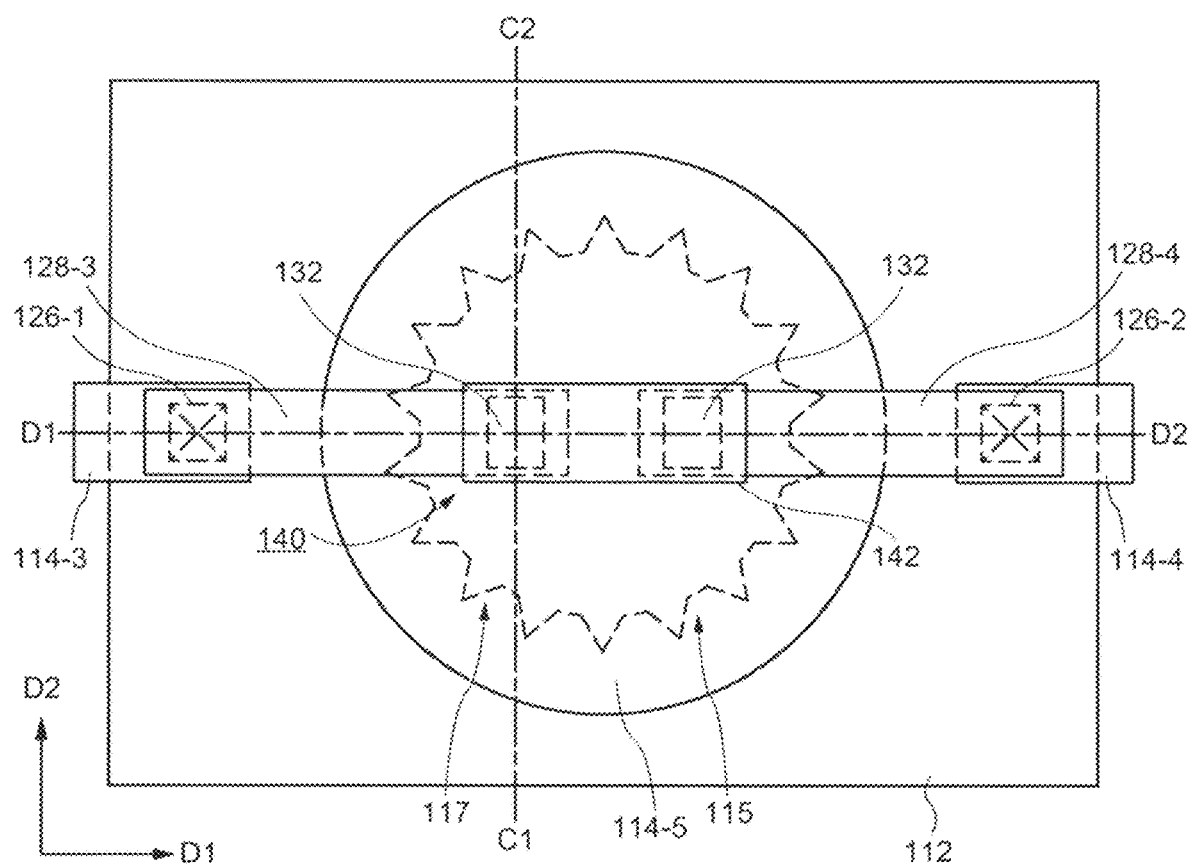
FIG. 11 is a plan view of an LED module according to an embodiment of the present invention.

FIG. 11 is a plan view of the LED module according to an embodiment of the present invention. A configuration of the LED module 100 according to the present embodiment is different from the configuration of the LED module 100 according to the sixth embodiment in that the shape of the first hole part 115 is an arc shape, and the arc includes a plurality of triangular notches 117 or a plurality of arc-shaped notches 117 along the arc. Description of the same configuration as that of the LED module 100 according to the sixth embodiment is omitted here. Description of the same or similar components as those of FIG. 1 to FIG. 10 may be omitted.

Since the cross-sectional shape along the line C1-C2 of the LED module 100 according to an embodiment of the present invention is similar to the shape shown in FIG. 7A and the cross-sectional shape along the line D1-D2 line is similar to the shape shown in FIG. 7B, the description thereof will be omitted.

Similar to the configuration shown in FIG. 8, the configuration of the LED module 100 according to the present embodiment may have the fifth conductor 128-5 and the sixth conductor 128-6. In the case where the LED module 100 according to the present embodiment has the fifth conductor 128-5 and the sixth conductor 128-6, the shape of the fifth conductor 128-5 and the sixth conductor 128-6 is an arc shape, and the arc includes the plurality of triangular notches or the plurality of arc shaped notches along the arc.

The LED module 100 according to an embodiment of the present invention has the arc-shaped first hole part 115 including the plurality of triangular notches 117 or the plurality of arc-shaped notches 117 along the arc, and the third structure 114-5 included in the second conductive film overlaps the upper surface and the side surface of the first conductive film 112, and the first hole part 115. In the LED module 100 according to an embodiment of the present invention, the cross-sectional shape of the first conductive film 112 and the third structure 114-5 is a tapered shape. With the configuration described above, in the LED module 100 according to an embodiment of the present invention, it is possible to increase the area to reflect light as compared with the case where the shape of the first hole part 115 is polygonal. Therefore, since the light of the LED chip 140 can be reflected in a wider area of the structure, light can be more efficiently extracted from the counter substrate 150 sides.

Eighth Embodiment

Figure 12:
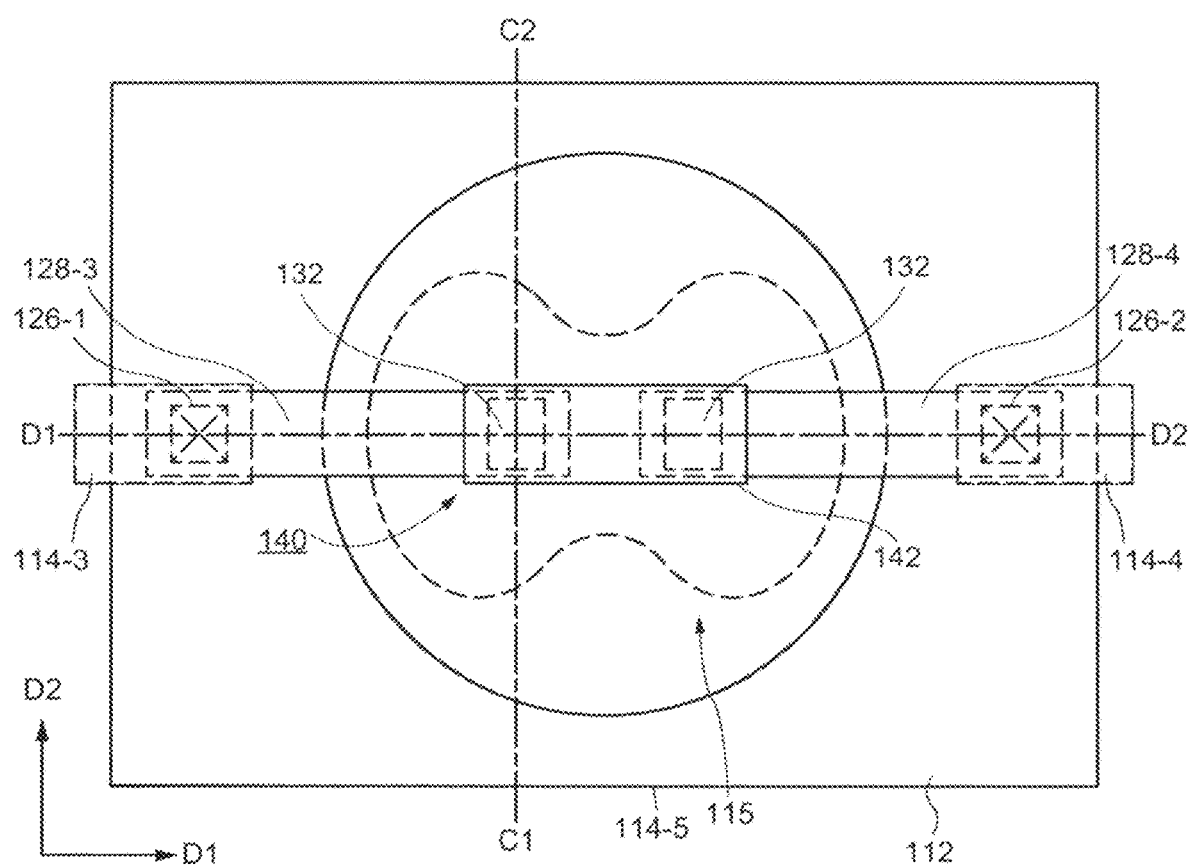
FIG. 12 is a plan view of an LED module according to an embodiment of the present invention.

FIG. 12 is a plan view of the LED module according to an embodiment of the present invention. The configuration of the LED module 100 according to the present embodiment is different from the configuration of the LED module 100 according to the sixth embodiment in that the first hole part 115 is a gourd shape. Description of the same configuration as that of the LED module 100 according to the sixth embodiment is omitted here. Description of the same or similar components as those of FIG. 1 to FIG. 11 may be omitted.

Since the cross-sectional shape along the line C1-C2 of the LED module 100 according to an embodiment of the present invention is similar to the shape shown in FIG. 7A, and the cross-sectional shape along the line D1-D2 is similar to the shape shown in FIG. 7B, the description thereof will be omitted.

Similar to the configuration shown in FIG. 8, the configuration of the LED module 100 according to the present embodiment may have the fifth conductor 128-5 and the sixth conductor 128-6. In the case where the LED module 100 according to the present embodiment has the fifth conductor 128-5 and the sixth conductor 128-6, the shape of the fifth conductor 128-5 and the sixth conductor 128-6 is a part of the gourd shape.

The LED module 100 according to an embodiment of the present invention has the gourd-shaped first hole part 115, and the third structure 114-5 included in the second conductive film overlaps the upper surface and the side surface of the first conductive film 112, and the first hole part 115. In the LED module 100 according to an embodiment of the present invention, the cross-sectional shapes of the first conductive film 112 and the third structure 114-5 are a tapered shape. With the configuration described above, in the LED module 100 according to an embodiment of the present invention, it is possible to increase the area to reflect light as compared with the case where the shape of the first hole part 115 is polygonal. Therefore, since the light of the LED chip 140 can be reflected in a wider area of the structure, light can be extracted more efficiently from the counter substrate 150 sides.

Ninth Embodiment

Figure 13:
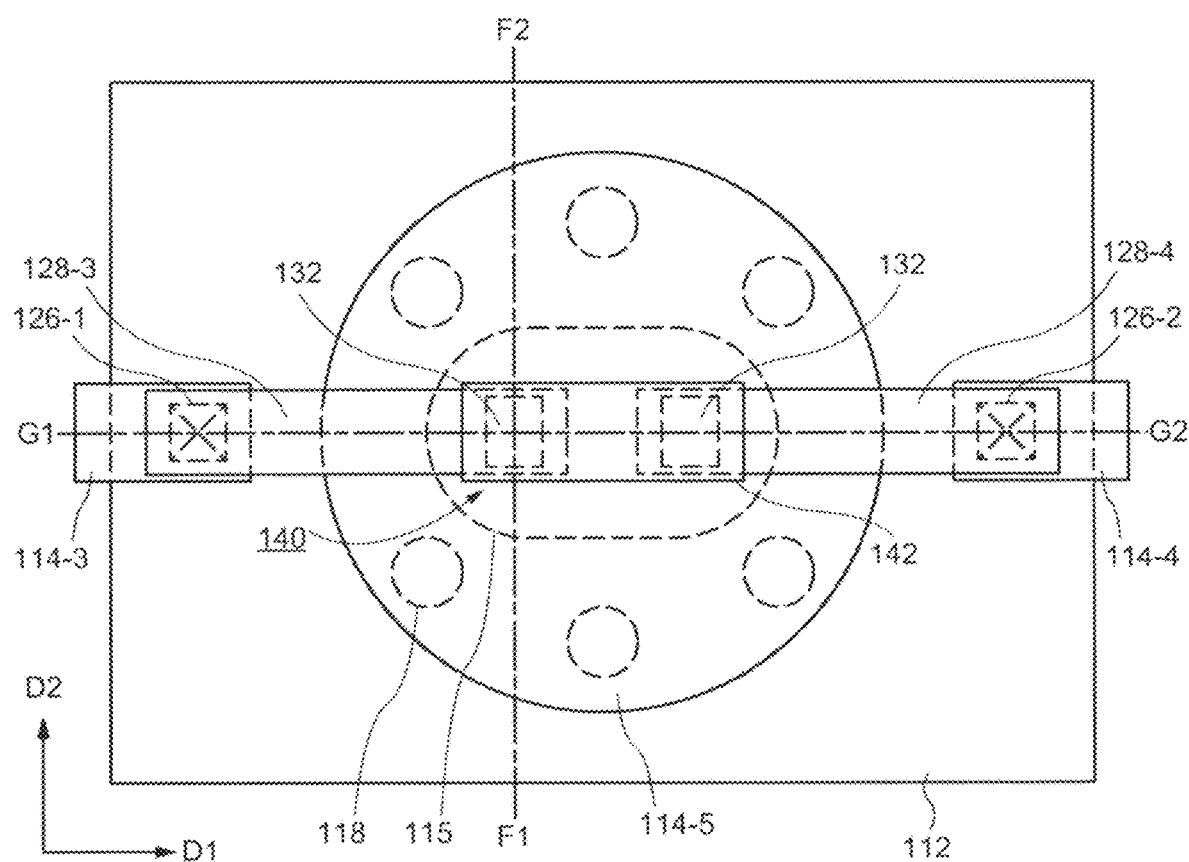
FIG. 13 is a plan view of an LED module according to an embodiment of the present invention.
Figure 14A:
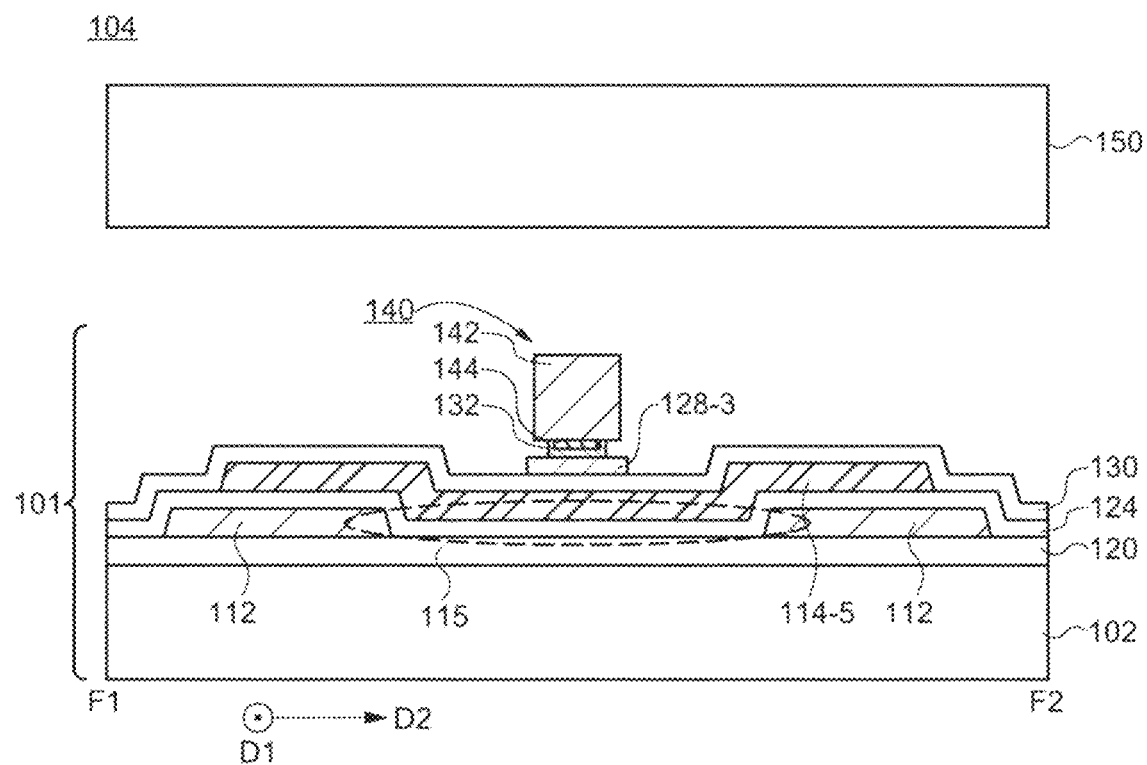
FIG. 14A is a cross-sectional view along a line F1-F2 of an LED module according to an embodiment of the present invention.
Figure 14B:
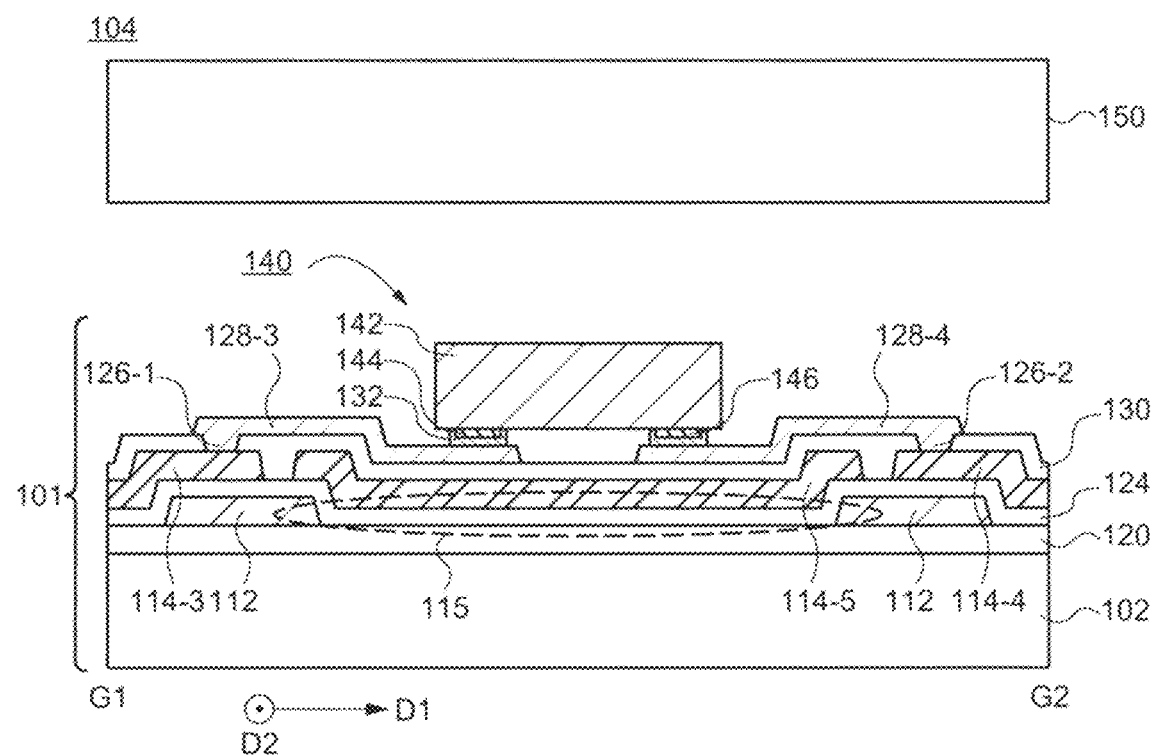
FIG. 14B is a cross-sectional view along a line G1-G2 of an LED module according to an embodiment of the present invention.
Figure 15:
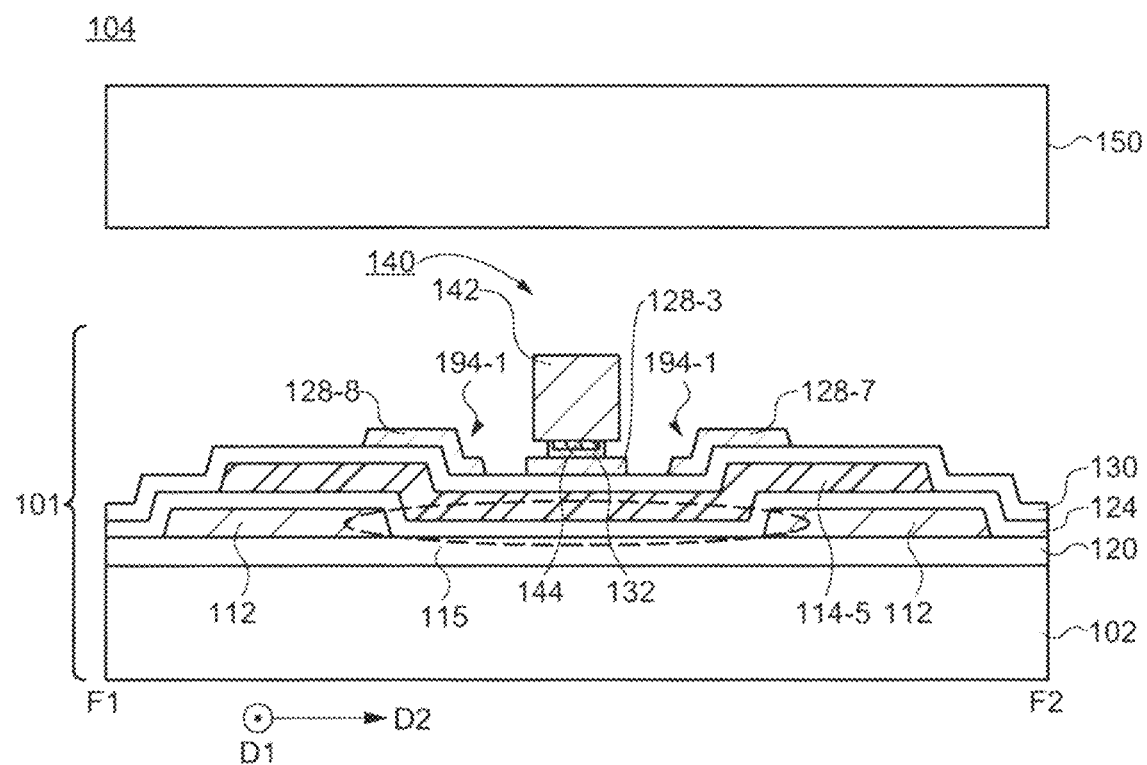
FIG. 15 is a cross-sectional view along a line F1-F2 of an LED module according to an embodiment of the present invention.

FIG. 13 is a plan view of the LED module according to an embodiment of the present invention. FIG. 14A is a cross-sectional view showing a cross-sectional shape along a line F1-F2 of the LED module 100 according to an embodiment of the present invention. FIG. 14B is a cross-sectional view showing a cross-sectional shape along a line G1-G2 of the LED module 100 according to an embodiment of the present invention. FIG. 15 is a cross-sectional view along the line F1-F2 in another configuration of the LED module 100 according to an embodiment of the present invention. The configuration of the LED module 100 according to the present embodiment is different from the configuration of the LED module 100 according to the sixth embodiment in that the first hole part 115 has an elliptical shape and has a plurality of second hole parts 118. Description of the same configuration as that of the LED module 100 according to the sixth embodiment is omitted here. Description of the same or similar components as those of FIG. 1 to FIG. 12 may be omitted.

In the present embodiment, an example in which different-sized hole parts are mixed is shown. The first hole part 115 and the plurality of second hole parts 118 are provided in the same layer. That is, similar to the first hole part 115, the second hole part 118 exposes the upper surface (plane surface) of the first insulating film 120. The first conductive film 112 has a structure in which the first hole part 115 and the plurality of second hole parts 118 are hollowed. In a cross-sectional view, the first conductive film 112 has a convex part. The convex part forms the shape of the first hole part 115 and the shape of the plurality of second hole parts 118. In other words, the convex part defines the first hole part 115 and the plurality of second hole parts 118. The first hole part 115 and the plurality of second hole parts 118 overlap the convex part. For example, the size of the first hole part 115 is larger than the size of the second hole part 118. The first hole part 115 is provided in the vicinity of the LED chip 140. The plurality of second hole parts 118 is provided around the periphery of the first hole part 115. In FIG. 13, although an example is shown in which the second hole part 118 is circular, the shape of the second hole part 118 is not limited to this shape. The shape of the second hole part 118 may be, for example, an elliptical shape.

Similar to the configuration shown in FIG. 8, the configuration of the LED module 100 according to the present embodiment may have the fifth conductor 128-5 and the sixth conductor 128-6. In the case where the LED module 100 according to the present embodiment has the fifth conductor 128-5 and the sixth conductor 128-6, the shape of the fifth conductor 128-5 and the sixth conductor 128-6 is a part of the elliptical shape. For example, as in the cross-sectional view shown in FIG. 15, a seventh conductor 128-7 corresponding to the fifth conductor 128-5 and an eighth conductor 128-8 corresponding to the sixth conductor 128-6 are provided. The second conductive film may have a conductor overlapping the second hole part. In the case where the second conductive film has a ninth conductor, the ninth conductor is provided so that the reflected light of the LED chip 140 is emitted in the direction toward the LED chip 140 or the counter substrate 150. The shape of the seventh conductor, for example, in a plan view, may be a semi-circular shape or a shape having an arc shorter than a semi-circle.

As shown in FIG. 13 and FIG. 14A, the size of the first hole part 115 according to the present embodiment is smaller than the size of the first hole part 115 according to the sixth embodiment shown in FIG. 10 and FIG. 7A. In the cross-section of the LED module 100 shown in FIG. 14A and FIG. 14B, since the configuration is the same as that shown in FIG. 7A and FIG. 7B except for the size of the first hole part 115, the description is omitted here.

In the LED module 100 according to an embodiment of the present invention, different-sized hole parts can be mixed according to the emission specification of the LED chip 140.

Tenth Embodiment

Figure 16:
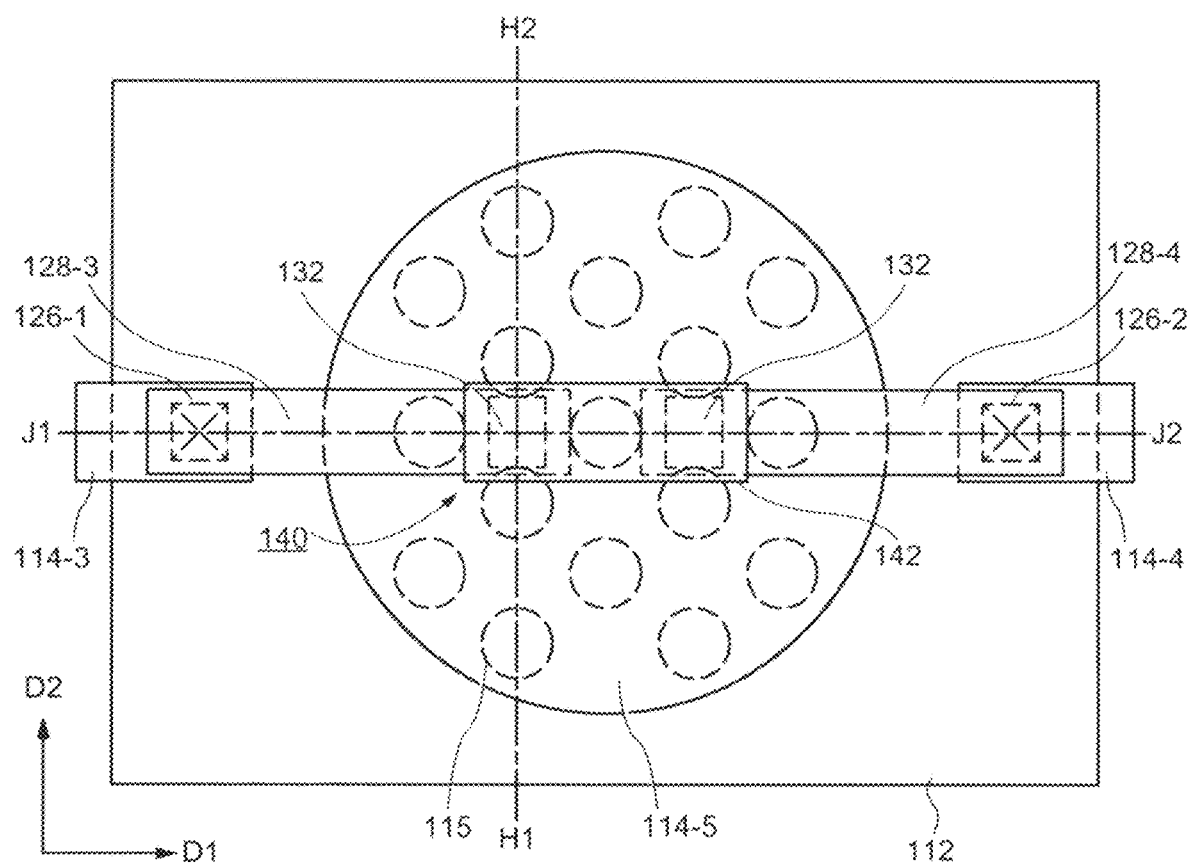
FIG. 16 is a plan view of an LED module according to an embodiment of the present invention.
Figure 17A:
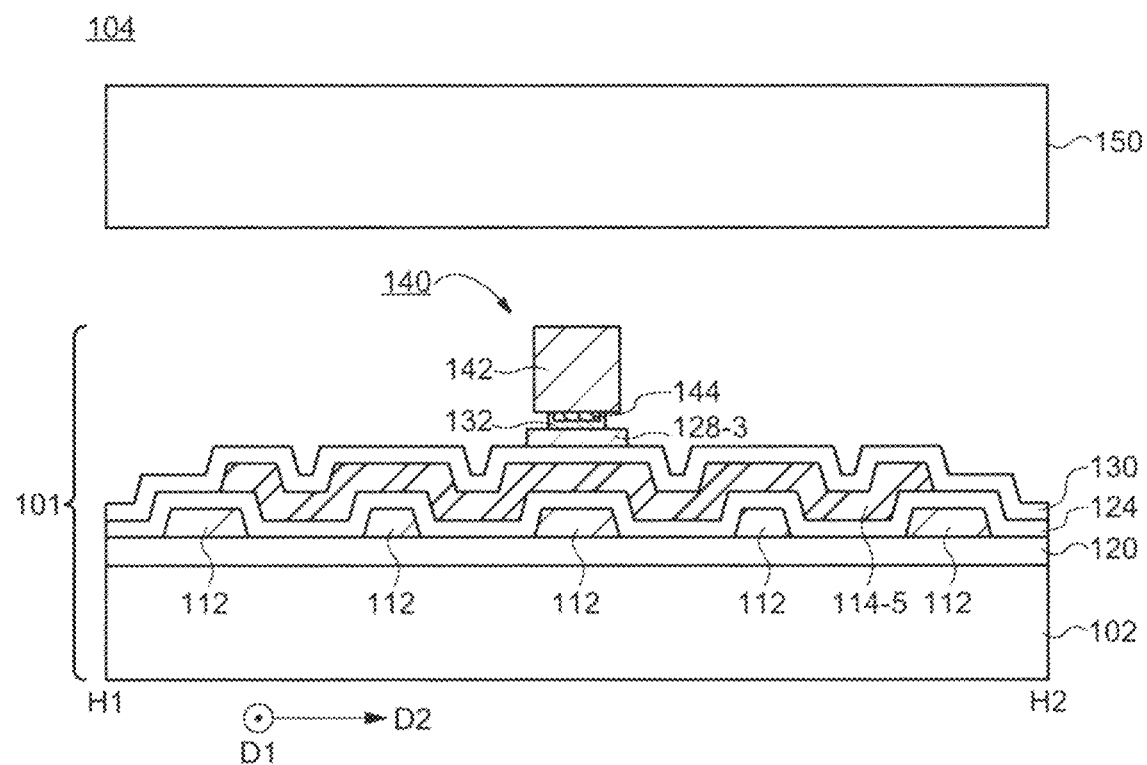
FIG. 17A is a cross-sectional view along a line H1-H2 line of an LED module according to an embodiment of the present invention.
Figure 17B:
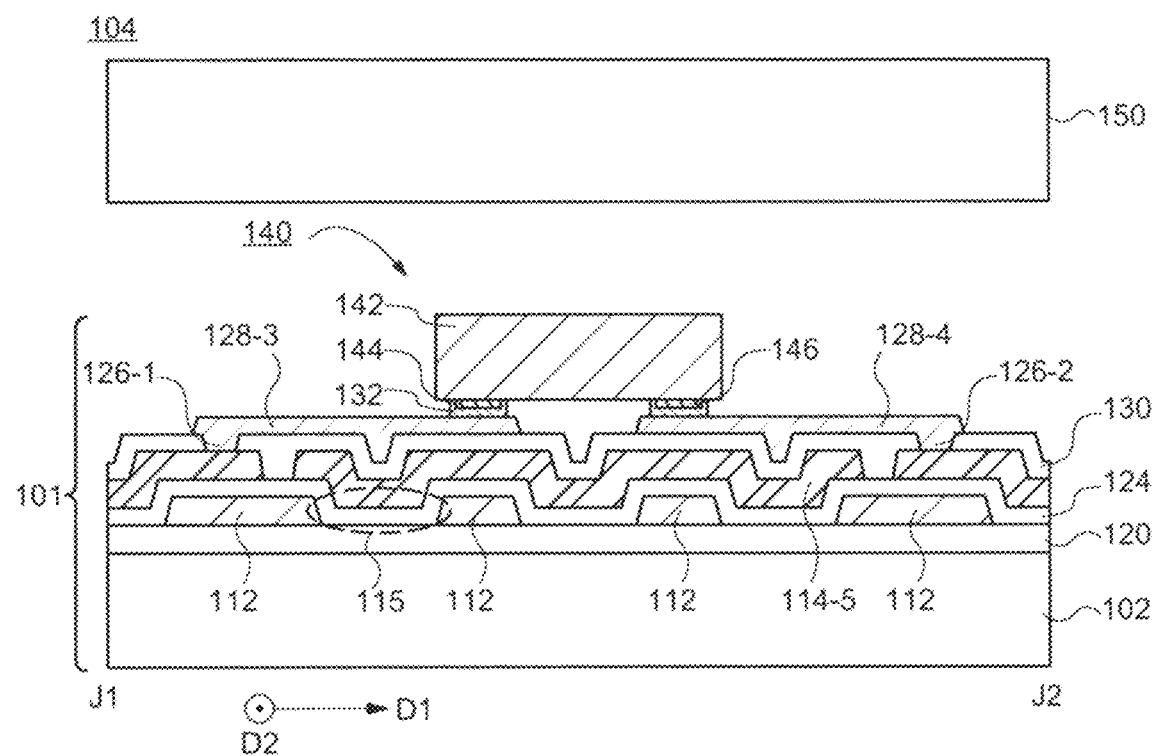
FIG. 17B is a cross-sectional view along a line J1-J2 of an LED module according to an embodiment of the present invention.
Figure 18:
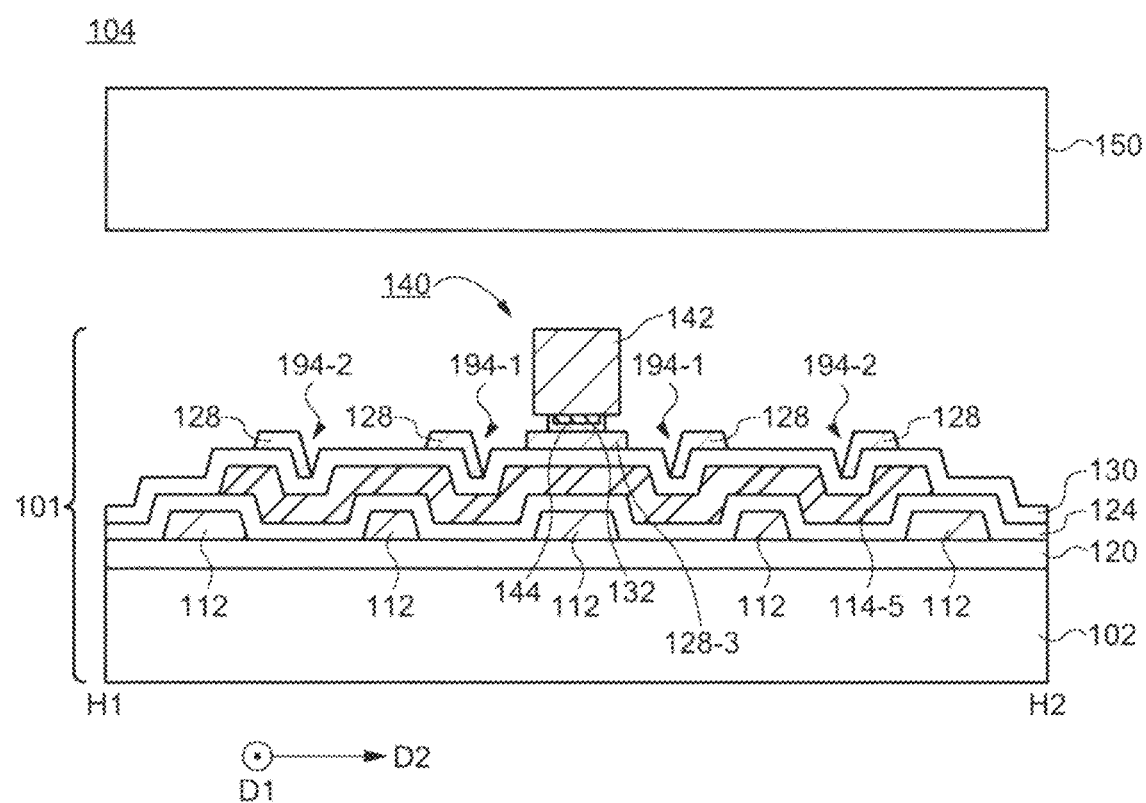
FIG. 18 is a cross-sectional view along a line H1-H2 of an LED module according to an embodiment of the present invention.

FIG. 16 is a plan view of the LED module according to an embodiment of the present invention. FIG. 17A is a cross-sectional view showing a cross-sectional shape along a line H1-H2 of the LED module 100 according to an embodiment of the present invention. FIG. 17B is a cross-sectional view showing a cross-sectional shape along a J1-J2 line of the LED module 100 according to an embodiment of the present invention. FIG. 18 is a cross-sectional view along the line H1-H2 of another configuration of the LED module 100 according to an embodiment of the present invention. The configuration of the LED module 100 according to the present embodiment is different from the configuration of the LED module 100 according to the sixth embodiment in that it has a plurality of first hole parts 115. Description of the same configuration as that of the LED module 100 according to the sixth embodiment is omitted here. Description of the same or similar components as those in FIG. 1 to FIG. 15 may be omitted.

In the present embodiment, an example in which the plurality of first hole parts 115 is included is shown. As shown in FIG. 16, in a plan view, the plurality of first hole parts 115 is randomly arranged inside the third structure 114-5. In other words, the first hole parts are provided on the sides where the LED chip 140 is provided with respect to the third structure 114-5 in a plan view.

As shown in FIG. 17A and FIG. 17B, the plurality of first hole parts 115 is provided so that the third structure 114-5 overlaps the second insulating film 124 and the plurality of first hole parts 115. Therefore, in the case where the third structure 114-5 has the plurality of first hole parts 115, the third structure 114-5 has a plurality of steps compared to the case where the third structure 114-5 has one first hole part 115. Thus, the third structure 114-5 has a plurality of tapered shapes.

Similar to the configuration shown in FIG. 8, the configuration of the LED module 100 according to the present embodiment may have a plurality of conductors 128 corresponding to the fifth conductor 128-5 and the sixth conductor 128-6 as shown in FIG. 18. In the case where the LED module 100 according to the present embodiment has the plurality of conductors 128, the plurality of conductors 128 is provided so that the reflected light of the LED chip 140 is emitted in the direction toward the LED chip 140 or the counter substrate 150. The shape of the plurality of conductors 128, for example, in a plan view, may be a semi-circular or a shape having an arc shorter than a semi-circle.

In the LED module 100 according to the present embodiment, since the third structure 114-5 has the plurality of tapered shapes, the light from the LED chip 140 can be diffusely reflected. Therefore, since the light emitted from the LED chip 140 in various directions can be condensed, the light extraction efficiency is further improved.

In the LED module 100 according to the present embodiment, the first hole part 115 may be provided below the LED chip 140. By providing the first hole part 115 below the LED chip 140, the light emitted downward from the LED chip 140 can also be reflected, and the light extraction efficiency is further improved.

Each of the embodiments described above as an embodiment of the present invention can be appropriately combined and implemented as long as no contradiction is caused.

Further, in the scope of the present invention, a person skilled in the art can correspond to various variations and modifications, and it is understood that these variations and modifications also belong to the scope of the present invention. For example, the addition, deletion, or design change of components as appropriate by those skilled in the art based on each embodiment are also included in the scope of the present invention as long as they are provided with the gist of the present invention.

Further, it is understood that the effects obvious from the description in the specification brought about by the mode in an embodiment of the present invention or appropriately predicted by persons skilled in the art are apparently derived from the present invention.

What is claimed is:

1. An LED module comprising:
a first layer including a first plane;
an LED chip arranged on the first plane;
a second layer surrounding the LED chip and including a convex part on the first plane; and
a third layer arranged outside the LED chip and overlapping an upper surface of the first layer, a side surface of the second layer, and a part of an upper surface of the second layer,
wherein
a height of the convex part of the second layer is lower than a height of an upper surface of the LED chip,
the first layer, the second layer and the third layer include conductive films,
the second layer is divided into a plurality of parts and includes a first convex part and a second convex part separated from each other,
a first wiring and a second wiring are arranged between the first convex part and the second convex part on the first plane and are insulated from the third layer, and
the LED chip is electrically connected to the first wiring and the second wiring.

2. The LED module according to claim 1, wherein
the first convex part and the second convex part have a tapered shape in a cross-sectional view.

3. The LED module according to claim 1, wherein
the first convex part and the second convex part are provided so as to face each other.

4. The LED module according to claim 1, wherein
the first convex part, the second convex part, and a part of the third layer have a polygonal shape or an arc shape in a plan view.

5. The LED module according to claim 1, wherein
the shapes of the first convex part and the second convex part facing the LED chip include a plurality of triangular notches or a plurality of arc shaped notches in a plan view.

6. The LED module according to claim 1, wherein
the first convex part and the second convex part include either a conductive film or an insulating film.

7. The LED module according to claim 2, wherein
the first layer is provided between a first insulating film and a second insulating film,
the second layer is provided between the second insulating film and a third insulating film, and
the third layer is provided on the third insulating film.

8. A display device comprising:
a plurality of pixels;
a driving circuit driving the plurality of pixels,
wherein each of the plurality of pixels includes a first layer including a first plane, an LED chip arranged on the first plane, a second layer and a third layer, the second layer surrounds the LED chip, and includes a convex part on the first plane, the third layer is arranged outside the LED chip, and overlaps an upper surface of the first layer, a side surface of the second layer and a part of an upper surface of the second layer, a height of the convex part of the second layer is lower than a height of an upper surface of the LED chip, the first layer, the second layer and the third layer include conductive films, the second layer is divided into a plurality of parts and includes a first convex part and a second convex part separated from each other, a first wiring and a second wiring are arranged between the first convex part and the second convex part on the first plane and are insulated from the third layer, and the LED chip is electrically connected to the first wiring and the second wiring.

* * * * *